United States Patent [19]
Kagami

[11] Patent Number: 5,940,331
[45] Date of Patent: Aug. 17, 1999

[54] OUTPUT CIRCUIT OF SEMICONDUCTOR MEMORY DEVICE

[75] Inventor: Akihiko Kagami, Tokyo, Japan

[73] Assignee: NEC Corporation, Tokyo, Japan

[21] Appl. No.: 09/143,382

[22] Filed: Aug. 28, 1998

[30] Foreign Application Priority Data

Aug. 28, 1997 [JP] Japan .................................. 9-231964

[51] Int. Cl.$^6$ .............................................. G11C 16/04
[52] U.S. Cl. ............................. 365/189.05; 365/189.11; 365/203; 327/57
[58] Field of Search ..................... 365/189.05, 189.11, 365/203, 194; 327/51, 57

[56] References Cited

U.S. PATENT DOCUMENTS

| | | | |
|---|---|---|---|
| 5,384,735 | 1/1995 | Park et al. ........................ | 365/189.05 |
| 5,384,736 | 1/1995 | Jung et al. ........................ | 365/189.05 |
| 5,444,661 | 8/1995 | Matsui ................................. | 365/201 |
| 5,488,581 | 1/1996 | Nagao et al. ...................... | 365/189.05 |
| 5,652,724 | 7/1997 | Manning ........................... | 365/189.05 |
| 5,822,254 | 10/1998 | Koshikawa et al. ............... | 365/189.05 |

FOREIGN PATENT DOCUMENTS 2-220294  9/1990  Japan .

*Primary Examiner*—David Nelms
*Assistant Examiner*—Tuan T. Nguyen
*Attorney, Agent, or Firm*—Foley & Lardner

[57] ABSTRACT

An output circuit of a semiconductor memory device is provided, which prevents a current from flowing through a pair of output transistors due to their ON-ON state. This output circuit is comprised of (a) first and second transfer gates for receiving first and second complementary read-bus data signals and for transferring the first and second read-bus data signals according to a transfer-gate control signal, (b) first and second latches for latching the first and second read-bus data signals transferred to first and second nodes, respectively, (c) a precharge signal generator for generating a precharge signal to precharge the first and second nodes to a same electric potential, (d) first and second transistor drivers for outputting first and second driving signals according to the first and second read-bus data signals latched at the first and second nodes, respectively, and (e) first and second complementary output transistors driven by the first and second driving signals outputted from the first and second drivers, respectively. The first and second nodes are respectively precharged to the same electric potentials by the precharge signal before the complementary first and second read-bus data signals are transferred by the first and second transfer gates and latched by the first and second latches at the first and second nodes, respectively.

5 Claims, 18 Drawing Sheets

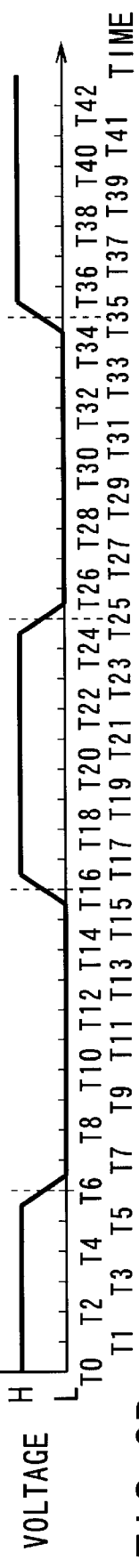
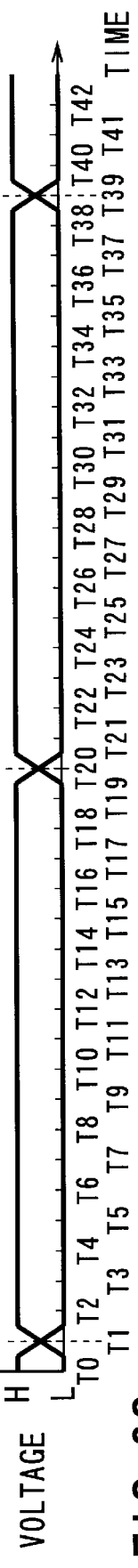
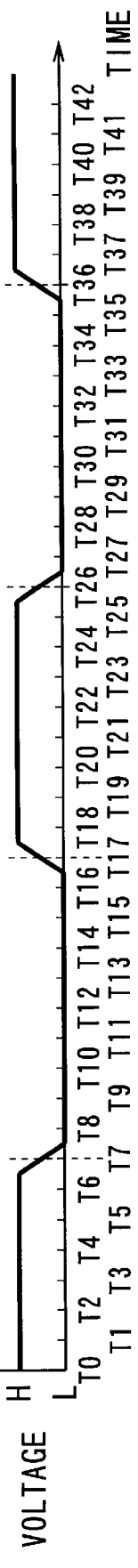
FIG. 2A PRIOR ART
FIG. 2B PRIOR ART
FIG. 2C PRIOR ART

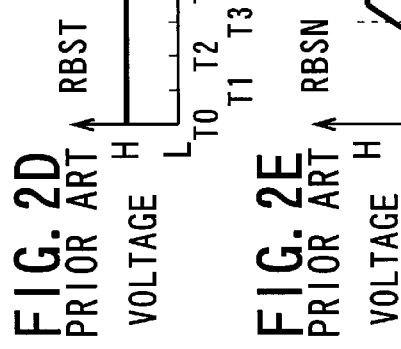

FIG. 2I PRIOR ART
FIG. 2J PRIOR ART
FIG. 2K PRIOR ART
FIG. 2L PRIOR ART

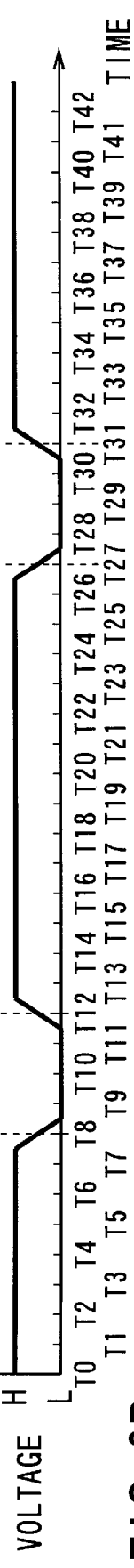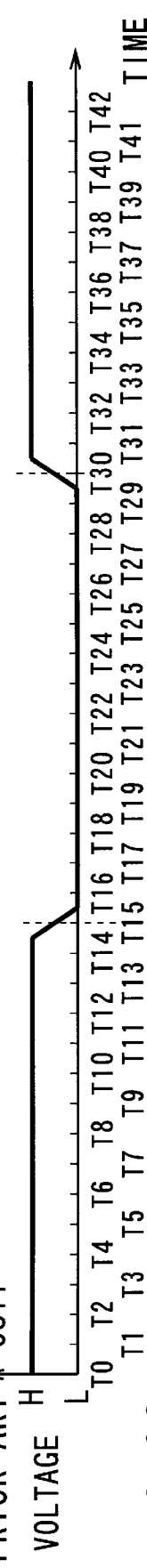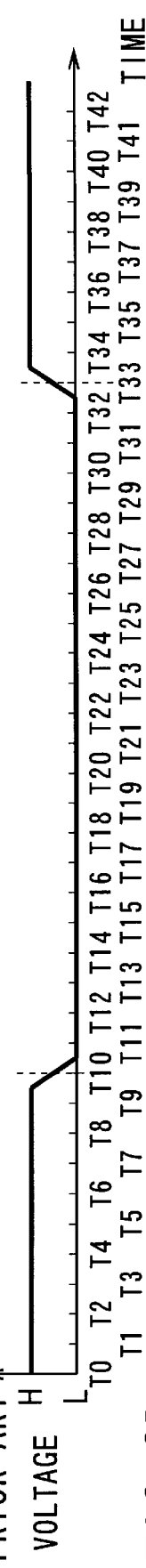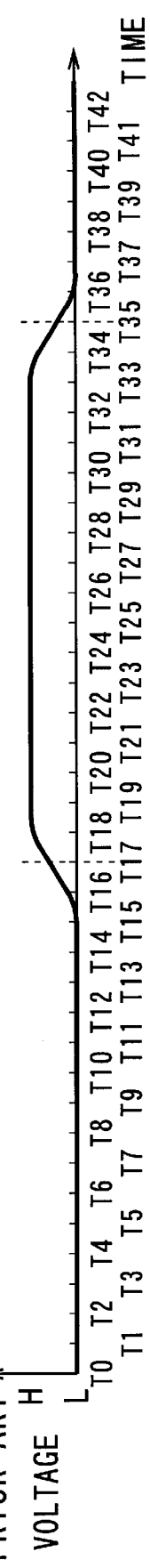
FIG. 3A PRIOR ART
FIG. 3B PRIOR ART
FIG. 3C PRIOR ART
FIG. 3D PRIOR ART

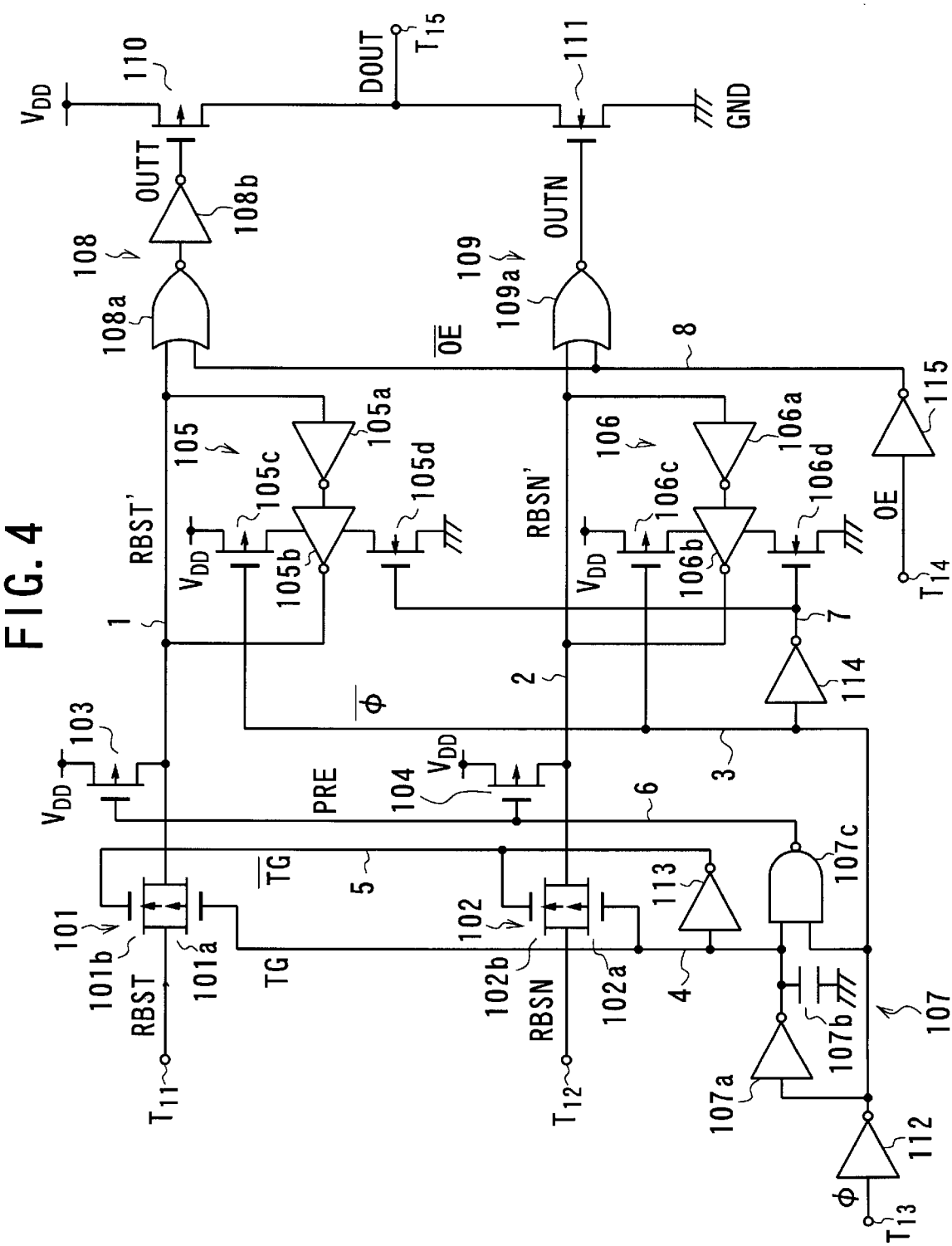

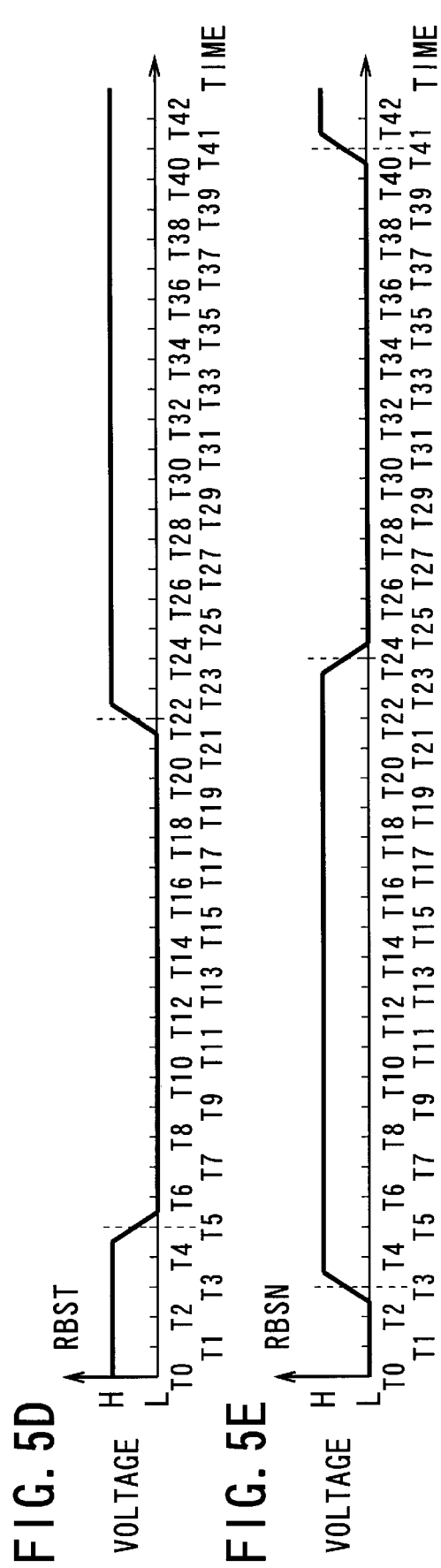

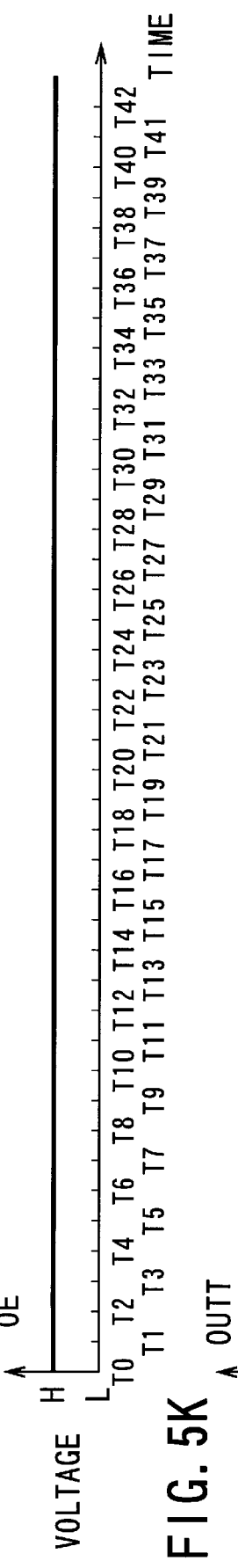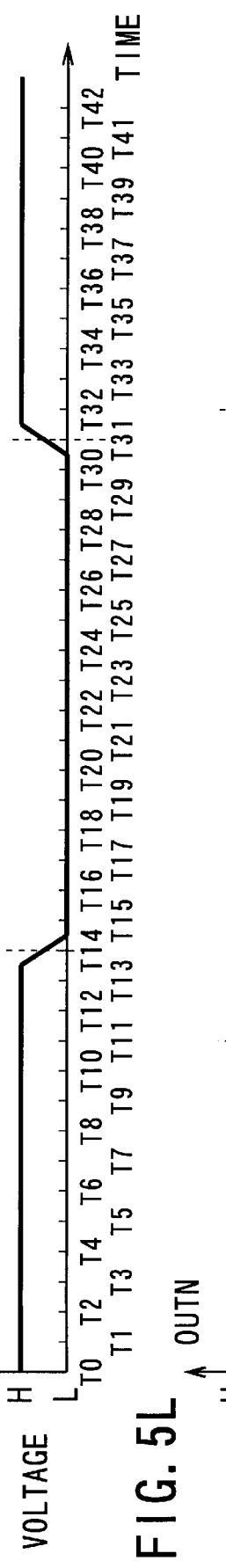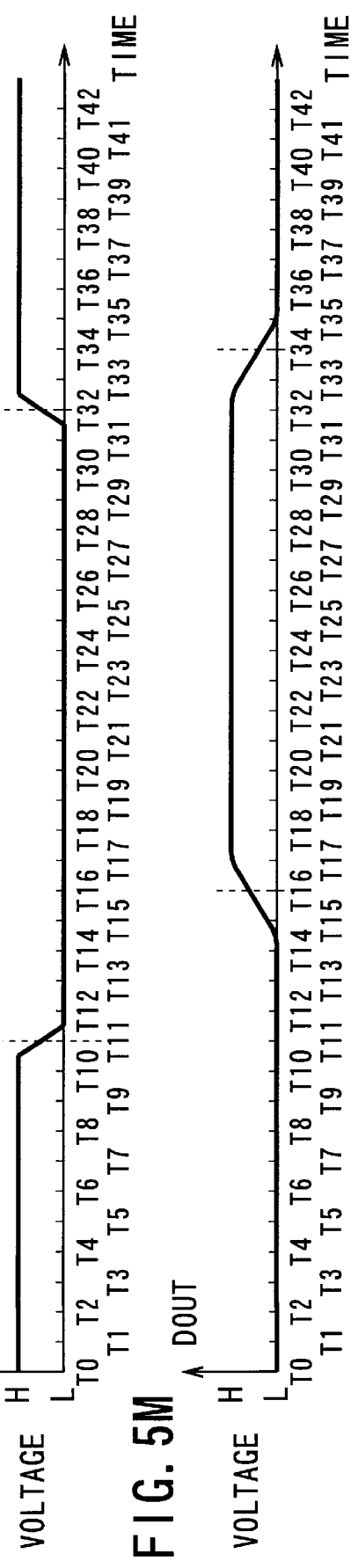

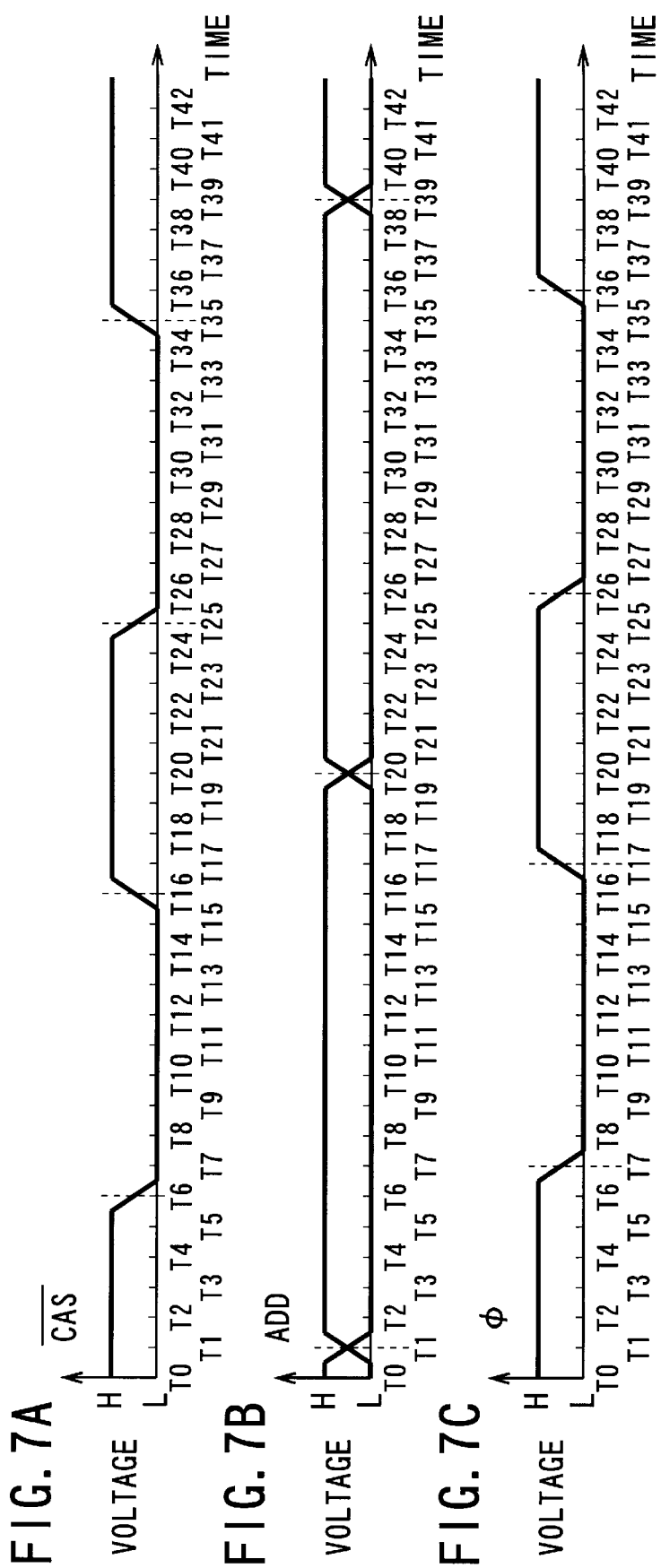

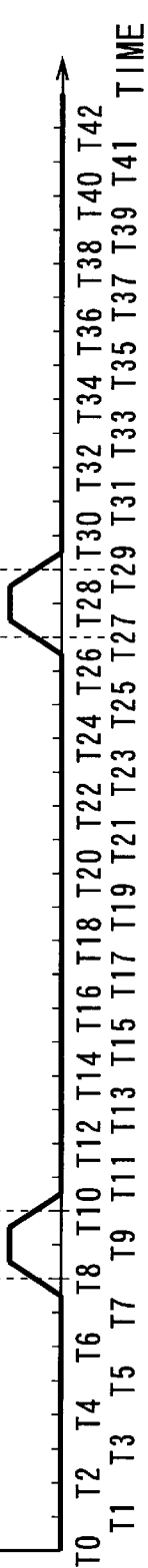
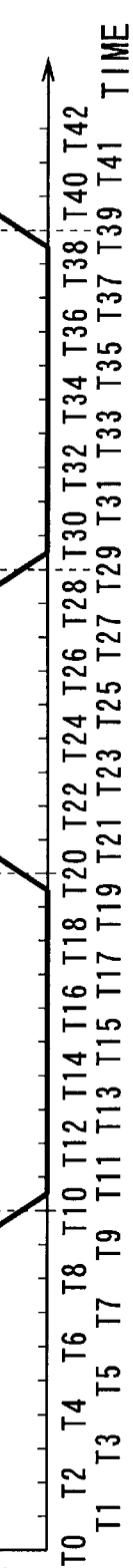
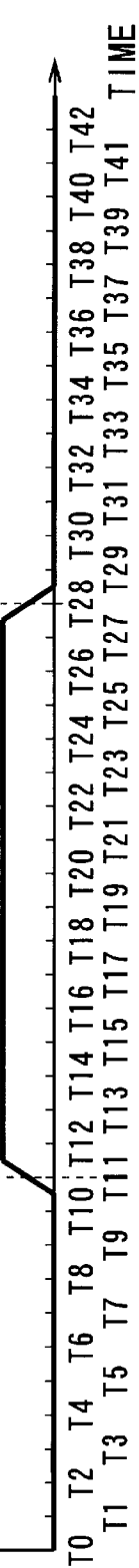
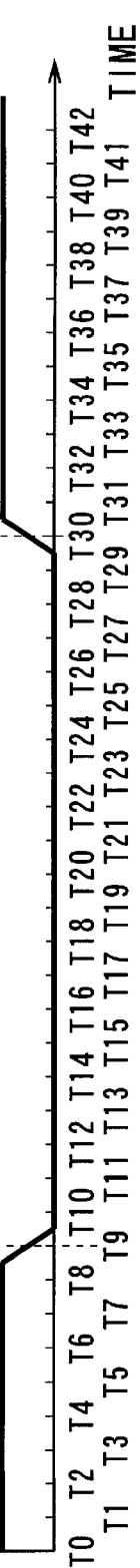
FIG. 7F
FIG. 7G
FIG. 7H
FIG. 7I

OUTPUT CIRCUIT OF SEMICONDUCTOR MEMORY DEVICE

BACKGROUND OF THE INVENTION

1. Field of the Invention

The present invention relates to an output circuit of a semiconductor memory device and more particularly, to an output circuit of a semiconductor memory device that outputs a pair of complementary data signals read out from a memory cell array of the semiconductor memory device.

2. Description of the Prior Art

In recent years, various Dynamic Random-Access Memories (DRAMs) having the "Extended Data Output (EDO)" function have been developed and practically used in the various application fields. This is because the DRAMs with the EDO function operate faster than the well-known "Fast-Page" mode DRAMs.

The "EDO" function is a function that the output behavior of the data signal that have been read out from the memory cell is continued during a specific period in a read cycle even after an external clock signal for controlling the output behavior is reset to specify a new column address. This is unlike the well-known "Fast-Page" mode DRAMs in which the output behavior of the data signal that have been read out from the memory cell is stopped in a read cycle synchronized with the reset of the external clock signal. As the external clock signal, a Column Address Strobe (CAS) signal is typically used.

In the DRAMs with the EDO function, accordingly, it is necessary for the output circuits to hold the data signal that has been read out from the memory cell during a specific period synchronized with an input pulse signal for the output circuits. As the input pulse signal for the output circuits, an Output Enable (OE) signal is typically used.

A conventional output circuit of a DRAM with the EDO function is shown in FIG. 1, which is comprised of a switching section, a data latch section, a driver section, and an output section.

The switching section has first and second transfer gates 701 and 702. The first transfer gate 701 is formed by a p-channel Metal-Oxide-Semiconductor Field-Effect Transistor (MOSFET) 701a and an n-channel MOSFET 701b. Sources of the MOSFETs 701a and 701b are coupled together to be connected to a first input terminal $T_{71}$. Drains of the MOSFETs 701a and 701b are coupled together to be connected to a first node 71. Similarly, the second transfer gate 702 is formed by a p-channel MOSFET 702a and an n-channel MOSFET 702b. Sources of the MOSFETs 702a and 702b are coupled together to be connected to a second input terminal $T_{72}$. Drains of the MOSFETs 702a and 702b are coupled together to be connected to a second node 72.

The first input terminal $T_{71}$ is connected to a first read bus (not shown) of the DRAM and is applied with a first read bus data signal RBST. The second input terminal $T_{72}$ is connected to a second read bus (not shown) of the DRAM and is applied with a second read bus data signal RBSN complementary to the first read bus data signal RBST.

The switching section further includes three cascade-connected inverters 712a, 712b, and 713 for controlling the transfer gates 701 and 702, in which the inverters 712a and 712b serve as a buffer circuit. An input of the inserter 712a is connected to a third input terminal $T_{73}$. An output of the inverter 712a is connected to an input of the inverter 712b. An output of the inverter 712b is connected to an input of the inverter 713 and a gate of the MOSFET 701a of the first transfer gate 701 and a gate of the MOSFET 702a of the second transfer gate 702. An output of the inverter 713 is connected to a gate of the MOSFET 701b of the first transfer gate 701 and a gate of the MOSFET 702b of the second transfer gate 702.

The third input terminal $T_{73}$ is connected to a clock generator (not shown) of the DRAM and in applied with a transfer-gate control signal φ.

The inverter 712b outputs a transfer-gate control signal TG to the inverter 713 and the gates of the MOSFETs 701a and 702a according to the applied transfer control signal φ. The inverter 713 outputs an inverted transfer-gate control signal $\overline{TG}$ to the gates of the MOSFETs 701b and 702b according to the applied transfer-gate control signal TG.

The first and second transfer gates 701 and 702 are controlled by the transfer-gate control signal TG and the inverted transfer-gate control signal $\overline{TG}$, thereby transferring the first and second read bus data signals RBST and RBSN to the first and second nodes 71 and 72, respectively.

The data latch section has first and second flip-flops 705 and 706. The first flip-flop 705 is formed by two inverters 705a and 705b connected in cascade to make a loop. An input and an output of the inverter 705a are connected to the first node 71 and an input of the inverter 705b, respectively. An output of the inverter 705b is connected to the first node 71. Similarly, the second flip-flop 706 is formed by two inverters 706a and 706b connected in cascade to make a loop. An input and an output of the inverter 706a are connected to the second node 72 and an input of the inverter 706b, respectively. An output of the inverter 706b is connected to the second node 72.

The first flip-flop 705 temporarily holds or latches the applied read bus data signal RBST at the first node 71. The first read bus data signal RBST thus latched in the first flip-flop 705 is termed a first read bus data signal RBST'.

Similarly, the second flip-flop 706 temporarily holds or latches the second read bus data signal RBSN at the second node 72. The second read bus data signal RBSN thus latched in the second flip-flop 706 is termed a second read bus data signal RBSN'.

The driver section has first and second transistor drivers 708 and 709 and an inverter 715. The first transistor drivers 708 is formed by a NOR gate 708a and an inverter 708b. First and second inputs of the NOR gate 708a are connected to the first node 71 and an output of the inverter 715, respectively. An output of the NOR gate 708a is connected to an input of the inverter 708b. An output of the inverter 708b is connected to a gate of a p-channel output MOSFET 710. The second driver circuit 709 is formed by a NOR gate 709a. First and second inputs of the NOR gate 709a are connected to the second node 72 and the output of the inverter 715, respectively. An output of the NOR gate 709a is connected to a gate of an n-channel output MOSFET 711.

An input of the inverter 715 is connected to a fourth input terminal $T_{74}$ to which an output-enable signal OE is applied. The inverter 715 serves as a buffer circuit for the signal OE. The inverter 715 outputs an inverted Output Enable signal $\overline{OE}$ according to the applied signal OE to the second inputs of the NOR gates 708a and 709a.

In response to the first read bus data signal RBST' and the inverted output-enable signal $\overline{OE}$, the first driver 708 outputs a first driving signal OUTT to the gate of the p-channel MOSFET 710. In response to the second read bus data signal RBSN' and the inverted output-enable signal $\overline{OE}$, the second driver 709 outputs a second driving signal OUTN to the gate of the n-channel MOSFET 711.

The output section has the p- and n-channel MOSFETs 710 and 711 serving as output transistors. A source of the MOSFET 710 is connected to a power supply line applied with a power supply voltage $V_{DD}$. A drain of the MOSFET 710 is connected to a drain of the MOSFET 711. A source of the MOSFET 711 is connected to the ground. The gate of the MOSFET 710 is connected to the output of the inverter 708b of the first driver 708. The gate of the MOSFET 711 is connected to the output of the NOR gate 709a of the second driver 709. The coupled drains of the MOSFETs 710 and 711 are connected to an output terminal $T_{75}$ through which an output data signal DOUT is derived.

When the p-channel output MOSFET 710 is in the ON state and the n-channel output MOSFET 711 is in the OFF state, the output data signal DOUT is equal to the power supply voltage $V_{DD}$. On the other hand, when the n-channel output MOSFET 711 is in the ON state and the p-channel output MOSFET 710 is in the OFF state, the output data signal DOUT is equal to the ground potential (GND), i.e., zero.

Next, the operation of the conventional output circuit of FIG. 1 is explained below with reference to FIGS. 2A to 2L.

FIGS. 2A to 2L are timing diagrams showing the waveforms of the signals used in the conventional output circuit shown in FIG. 1.

Here, it is supposed that a Row Address Strobe (RAS) signal has been already activated and that a desired row address has been already fetched and that the data signals corresponding to the specified row address have been amplified by a sense amplifier (not shown). A data signal corresponding to a column specified by a CAS signal is selected from the data signals corresponding to the specified row address and then, it is transmitted to the first and second read bus lines.

FIG. 2A shows the signal CAS serving as an external clock signal. FIG. 2B shows a column address signal ADD. FIG. 2C shows the transfer control signal φ applied to the third input terminal $T_{73}$, which is synchronized with the external clock signal CAS shown in FIG. 2A. FIGS. 2D and 2E show the first and second read bus data signals RBST and RBSN transmitted through the first and second input terminals $T_{71}$ and $T_{72}$, respectively, in which these two signals RBST and RBSN are complementary. FIG. 2F shows the transfer-gate control signal TG, which is generated from the transfer control signal φ. FIGS. 2G and 2H show the first and second read bus data signals RBST' and RBSN' latched in the first and second flip-flops 705 and 706, respectively, in which these two signals RBST' and RBSN' are complementary. FIG. 2I shows the output-enable signal OE. FIGS. 2J and 2K show the first and second driving signals OUTT and OUTN, respectively. FIG. 2L shows the output data signal DOUT.

If the column address signal ADD is activated (i.e., turned from the low logic state L to the high logic state H, or turned from the high logic state H to the low logic state L) at the time T1, as shown in FIG. 2B, the second read bus data signal RBSN is turned from the low logic state L to the high logic state H at the time T3, as shown in FIG. 2E. At this time, the first read bus data signal RBST is kept at the high logic state H, as shown in FIG. 2D.

Then, at the time T5, the first read bus data signal RBST is turned from the logic state H to the logic state L, as shown in FIG. 2D.

When the external clock signal CAS is turned from the logic state H to the logic state L (i.e., activated) at the time T6 according to the change of the column address signal ADD, the transfer control signal φ is turned to the logic state L at the time T7. Accordingly, the transfer-gate control signal TG is turned to the logic state L at the time T9 and the first and second transfer gates 701 and 702 are opened, thereby transferring the first and second read bus data signals RBST and RBSN to the first and second nodes 71 and 72, respectively, as shown in FIGS. 2D and 2E.

Thus, the first read bus data signal RBST' latched at the first node 71 is turned from the logic state H to the logic state L at the time T10 and at the same time, the second read bus data signal RBSN' latched at the second node 72 is turned from the logic state L to the logic state H, as shown in FIGS. 2G ad 2H.

Due to the latched read bus data signals RBST' and RBSN', the second driving signal OUTN is turned from the logic state H to the logic state L at the time T11, and the first driving signal OUTT is turned from the logic state H to the logic state L at the time T12, as shown in FIGS. 2J and 2K. Thus, the n-channel MOSFET 711 is turned to the OFF state and the p-channel MOSFET 710 is turned to the ON state. The first and second driving signals OUTT and OUTN are not affected by the output-enable signal OE, because the output-enable signal OE is always fixed at the logic state H during the read out cycles, as shown in FIG. 2I.

As a result, the output signal DOUT is turned from the logic state L to the logic state H at the time T14, as shown in FIG. 2L.

Following this step, the external clock signal CAS is turned to the logic state H (i.e., the signal CAS is reset) at the time T16. In response to this change of the signal. CAS, the transfer control signal φ is turned to the logic state H at the time T17. Due to the change of the signal φ, the transfer-gate control signal TG is turned to the logic state H at the time T19, thereby separating the first and second read buses from the first and second flip-flops 705 and 706. At this stage, the first and second read bus data signals RBST' and RBSN' are latched by the first and second flip-flops 705 ad 706 and therefore, the output data signal DOUT is kept in the logic state H. This means that the EDO function is realized.

Subsequently, to start a next read cycle, the column address signal ADD is activated (i.e., turned from the logic state L to the logic state H, or turned from the logic state H to the logic state L) at the time T20. Then, the first read bus data signal RBST is turned from the logic state L to the logic state H at the time T22. At this time, the second read bus data signal RBSN is kept at the logic state H.

Then, at the time T24, the first read bus data signal RBSN is turned from the logic state H to the logic state L.

When the external clock signal CAS is turned from the logic state H to the logic state L (i.e., activated) at the time T25 according to the column address signal ADD, the transfer control signal φ is turned to the logic state L at the time T26. Thus, the transfer-gate control signal TG is turned to the logic state L at the time T28, thereby transferring the first and second read bus data signals RBST and RBSN to the first and second nodes 71 and 72, respectively.

Thus, the second read bus data signal RBSN' latched at the second node 72 is turned from the logic state H to the logic state L at the time T29 and at the same time, the first read bus data signal RBST' latched at the first node 71 is turned from the logic state L to the logic state H, as shown in FIGS. 2G and 2H.

Due to the latched read bus data signals RBST' and RBSN', the second driving signal OUTN is turned from the logic state L to the logic state H at the time T30, and the first driving signal OUTT is turned from the logic state L to the logic state H at the time T31. Thus, the n-channel output MOSFET 711 is turned to the ON state and the p-channel output MOSFET 710 is turned to the OFF state.

As clearly seen from FIGS. 2J, 2K and 2L, both of the first and second driving signals OUTN and OUTT are at the logic state L during the time period from T30 to T31. Therefore, both of the n- and p-channel MOSFETs 711 and 710 are kept in the ON state (i.e., in the ON-ON state) during the time period T from T30 to T31, as shown in FIG. 2L. In other words, the power supply line and the ground line are in short-circuit. Accordingly, a large current flows from the power supply line to the ground through the MOSFETs 710 and 711 and as a result, the level of the output signal DOUT lowers gradually, as shown in FIG. 2L.

Subsequently, to read out a next data, the external clock signal CAS is turned to the logic state H for resetting at the time T35. In response to this change of the signal CAS, the transfer control signal φ is turned to the logic state H at the time T36. Due to the change of the transfer control signal φ, the transfer-gate control signal TG is turned to the logic state H at the time T38, thereby separating the first and second read buses from the first and second flip-flops 705 and 706.

At this stage, the first and second read bus data signals RBST' and RBSN' are latched by the first and second flip-flops 705 ad 706 and therefore, the output data signal DOUT is kept in the logic state L for the purpose of the EDO function.

After the time T38, the same procedure as above is repeated.

As explained above, with the conventional output circuit in FIG. 1, both of the n- and p-channel MOSFETs 711 and 710 are kept in the ON state (i.e., in the ON-ON state) during the time period T from T30 to T31. Therefore, a problem that a large current flows from the power supply line to the ground line through the p- and n-channel output MOSFETs 710 and 711 during the period T will occur.

Also, the current flowing from the power supply line to the ground line changes the power supply level and the ground level. Therefore, the operation of the output circuit itself is badly affected.

Additionally, a different operation may be performed in the conventional output circuit in FIG. 1, as shown in FIGS. 3A to 3L, which illustrate the waveforms of the signals used in the conventional output circuit of in FIG. 1.

In this operation, to prevent the ON-ON state of the p- and n-channel MOSFETs 710 and 711 from occurring by the first and second driving signals OUTT and OUTN, the output-enable signal OE is clocked to be synchronized with the external clock signal CAS, as show in FIG. 3I.

The timing diagrams of the signals CAS, ADD, φ, RBST, RBSN, TG, RBST', and RBSN' are same as those in FIGS. 2A to 2H, respectively. Therefore, the explanation about those signals are omitted here for simplification.

When the external clock signal CAS is activated at the time T6, as shown in FIG. 2A, the output-enable signal OE is turned from the logic state H to the logic state L at the time T8, as shown in FIG. 3A. The timing of the change of the signal OE is prior to the time T10 on which the level of the latched data signals RBST' and RBSN' are changed.

Due to the change of the signal OE, the inverted output-enable signal $\overline{OE}$ is turned from the logic state L to the logic state H, thereby turning the second driving signal OUTN to the logic state L at the time T10. Thus, the n-channel MOSFET 711 is turned OFF, resulting in the OFF-OFF state of the p- and n-channel MOSFETs 710 and 711.

In the same way as that of the above-described operation using FIGS. 2A to 2L, the latched data signals RBST' and RBSN' are changed at the time T10, as shown in FIGS. 2G and 2H. However, the change of the signals RBST' and RBSN' is not transferred to the output MOSFETs 710 and 711, because the output-enable signal OE is in the logic state L. Thus, the output signal DOUT is kept in the logic state L at this stage.

Subsequently, if the output-enable signal OE is turned to the logic state H at the time T12, the first driving signal OUTT is turned from the logic state H to the logic state L at the time T15, as shown in FIGS. 3A and 3B. Thus, the p-channel MOSFET M710 is turned ON, as shown in FIG. 3D, which results in the ON state of the p-channel MOSFET 710 while the n-channel MOSFET 711 is kept in the OFF state. Consequently, the output signal DOUT is turned to the logic state H at the time T17.

If the external clock signal CAS is turned to the logic state L again at the time T25, the output-enable signal OE is turned from the logic state H to the logic state L at the time T27. The timing of the change of the signal OE is prior to the time T29 on which the level of the latched data signals RBST' and RBSN' are changed. This is due to the fact that the ON-ON state of the output MOSFETs 710 and 711 will occur if the signal OE is changed after the time T29.

In the same way as that of the above-described operation shown in FIGS. 2A to 2L, the latched data signals RBST' and RBSN' are changed at the time T29, as shown in FIGS. 2G and 2H. However, the change of the signals RBST' and RBSN' is not transferred to the output MOSFETs 710 and 711, because the output-enable signal OE is in the logic state L. Thus, the output signal DOUT is kept in the logic state H at this stage.

Due to the change of the output-enable signal OE at the time T27, the inverted output-enable signal $\overline{OE}$ is turned from the logic state L to the logic state H, thereby turning the first driving signal OUTT to the logic state H at the time T30. Thus, the p-channel MOSFET 710 is turned OFF, resulting in the OFF-OFF state of the p- and n-channel MOSFETs 710 and 711 at the time T30.

Subsequently, the output-enable signal OE is turned to the logic state H again at the time T31, which turns the second driving signal OUTN to the logic state H at the time T33 while keeping the first driving signal OUTT in the logic state H. Thus, the n-channel MOSFET M711 is turned ON at the time T33 while the p-channel MOSFET 710 is kept OFF. Consequently, the output data signal DOUT is turned to the logic state L at the time T35.

As explained above, in the operation shown in FIGS. 3A to 3D, the change of the first and second latched signals RBST' and RBSN' are not transferred to the p- and n-channel output MOSFETs 710 and 711 during the times T27 to T31 in which the output-enable signal OE is in the logic state L. In other words, the first driving signal OUTT is turned to the logic state H (i.e., the p-channel MOSFET is turned OFF) at the time T30 due to the signal OE before the second driving signal OUTN is turned to the logic state H (i.e., the n-channel MOSFET is turned ON) at the time T33.

Accordingly, the ON-ON state of the p- and n-channel output MOSFETs 710 and 711 are prevented from ooccurring.

However, the operation shown in FIGS. 3A to 3D has the following problem.

Specifically, it is popular that the output-enable signal OE is generated in a separated circuit block from the conventional output circuit shown in FIG. 1 and then, the signal OE is inputted into this output circuit. Therefore, the timing of change of the output-enable signal OE tends to be shifted or deviated in time with respect to the timing of change of the latched signals RBST' and RBSN' due to the phenomenon termed "skew".

If the change of the signal OE from the logic state L to the logic state H occurs earlier than the timing of change of the latched signals RBST' and RBSN', a large current tends to flow from the power supply line to the ground line due to the ON-ON state of the p- and n-channel MOSFETs 710 and 711.

On the other hand, if the change of the signal OE from the logic state L to the logic state H occurs later than the timing of change of the latched signals RBST' and RBSN', the output of the output data signal DOUT tends to be delayed.

Thus, it is very difficult to adjust or design the pulse width of the output-enable signal OE so that the ON-ON state of the p- and n-channel MOSFETs 710 and 711 are prevented from occurring.

SUMMARY OF THE INVENTION

Accordingly, an object of the present invention is to provide an output circuit of a semiconductor memory device that prevents a current from flowing through a pair of output transistors due to the ON-ON state of the pair of output transistors.

Another object of the present invention is to provide an output circuit of a semiconductor memory device that improves the access speeds.

Still another object of the present invention is to provide an output circuit of a semiconductor memory device that facilitates adjustment or design of the pulse width of a control signal.

The above objects together with others not specifically mentioned will become clear to those skilled in the art from the following description.

An output circuit of a semiconductor memory device according to the present invention is comprised of (a) first and second transfer gates for receiving first and second complementary read-bus data signals and for transferring the first and second read-bus data signals according to a transfer-gate control signal, (b) first and second latches for latching the first and second read-bus data signals transferred by the first and second transfer gates at first and second nodes, respectively, (c) a precharge signal generator for generating a precharge signal to precharge the first and second nodes to a same electric potential, (d) first and second transistor drivers for outputting first and second driving signals according to the first and second read-bus data signals latched by the first and second latches at the first and second nodes, respectively, and (e) first and second complementary output transistors driven by the first and second driving signals outputted from the first and second drivers, respectively.

The first and second nodes are respectively precharged to the same electric potentials by the precharge signal before the complementary first and second read-bus data signals are transferred by the first and second transfer gates and latched by the first and second latches at the first and second nodes, respectively.

Thus, the first and second driving signals from the first and second transistor drivers are outputted to the first and second output transistors at different timings, respectively, thereby preventing an ON-ON state of the first and second output transistors.

With the output circuit of a semiconductor memory device according to the present invention, the first and second nodes are respectively precharged to the same electric potential by the precharge signal before the complementary first and second read-bus data signals are transferred by the first and second transfer gates and latched by the first and second latches.

Therefore, the first and second driving signals from the first and second transistor drivers are outputted to the first and second output transistors at different timings, respectively. An ON-ON state of the first and second output transistors is prevented from occurring by suitably specifying these timings.

This means that no current flows through the complementary first and second output transistors due to their ON-ON state.

Because no current flows through the complementary first and second output transistors due to their ON-ON state, the electric potential of the power supply line and the ground line are prevented from fluctuating, resulting in improvement of the access speed of the semiconductor memory device.

Moreover, since the precharge signal can be readily generated in the output circuit according to the present invention, no timing deviation takes place due to the "skew". Consequently, the adjustment or design of the pulse width of the control signal, i.e., the precharge signals, is facilitated.

In a preferred embodiment of the output circuit according to the present invention, the precharge signal is generated by using the transfer-gate control signal.

In another preferred embodiment of the output circuit according to the present invention, first and second precharge transistors controlled by the precharge signal are additionally provided. The first and second precharge transistors serve to precharge the first and second nodes to the same electric potential, respectively.

In still another preferred embodiment of the output circuit according to the present invention, the same electric potential to which the first and second nodes are precharged is equal to a power supply voltage or a ground.

In a further preferred embodiment of the output circuit according to the present invention, the first and second output drivers includes first and second logic elements that prevent an ON-ON state of the first and second output transistors from occurring even if both of the first and second read-bus data signals latched at the first and second nodes are in a high logic state or a low logic state.

BRIEF DESCRIPTION OF THE DRAWINGS

In order that the present invention may be readily carried into effect, it will now be described with reference to the accompanying drawings.

FIGS. 2A to 2L are timing diagrams showing an operation of the conventional output circuit shown in FIG. 1, respectively.

FIGS. 3A to 3D are timing diagrams showing another operation of the conventional output circuit shown in FIG. 1, respectively.

FIG. 4 is a block diagram showing the circuit configuration of an output circuit of a semiconductor memory device with the EDO function according to a first embodiment of the prevent invention.

FIGS. 5A to 5M are timing diagrams showing an operation of the output circuit according to the first embodiment of FIG. 4, respectively.

FIGS. 7A to 7M are timing diagrams showing an operation of the output circuit according to the second embodiment of FIG. 6, respectively.

DETAILED DESCRIPTION OF THE PREFERRED EMBODIMENTS

Figure 1:
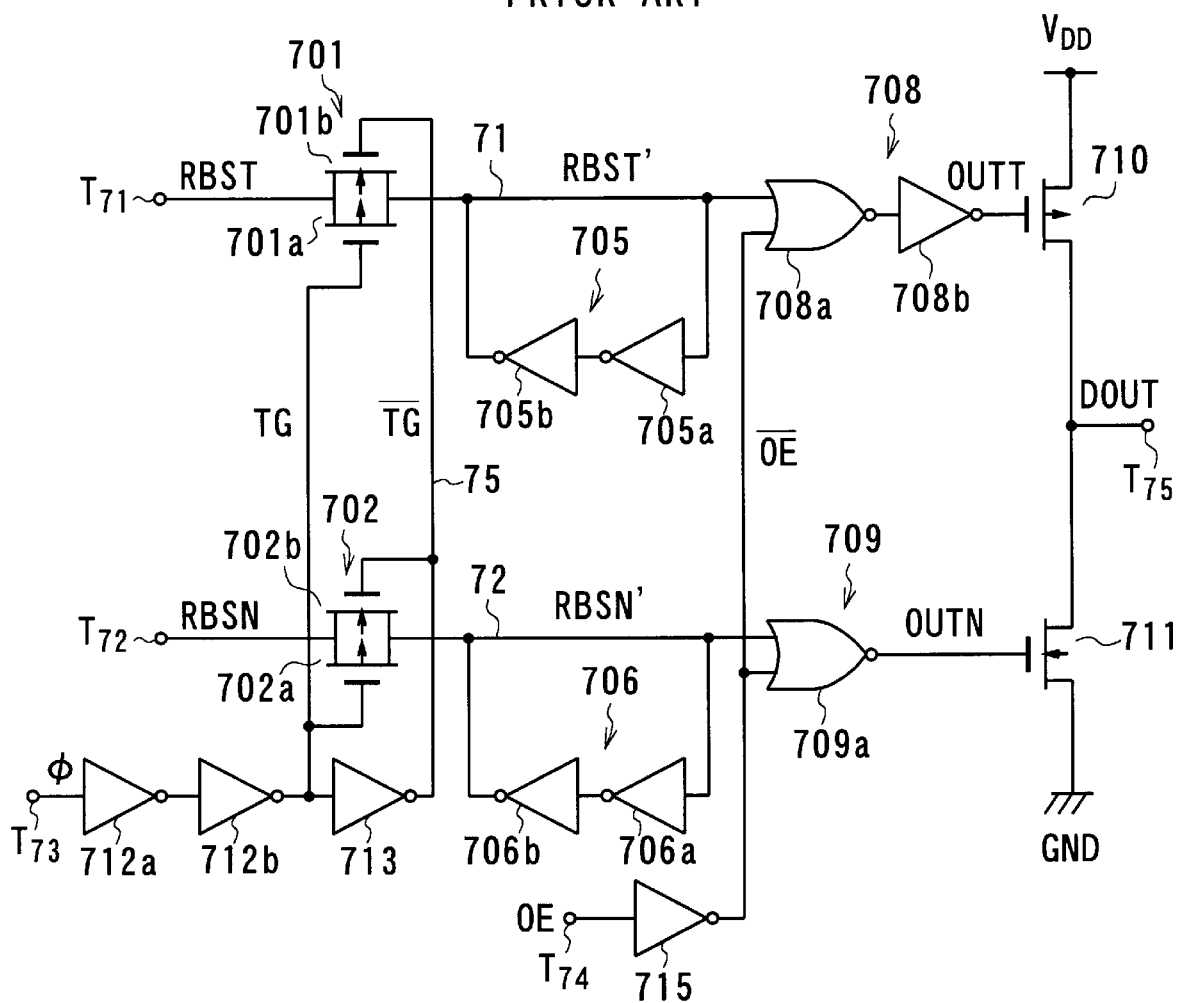
FIG. 1 is a block diagram showing the circuit configuration of a conventional output circuit of a semiconductor memory device with the EDO function.
Figure 2F:
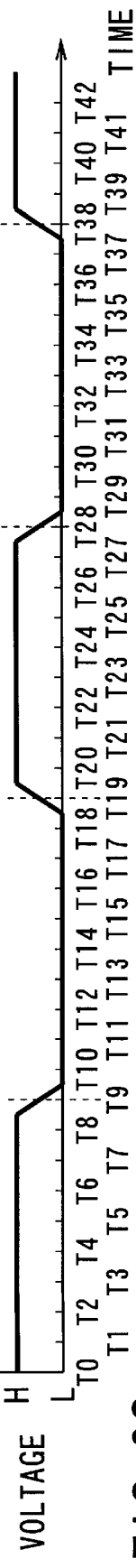
Figure 2G:
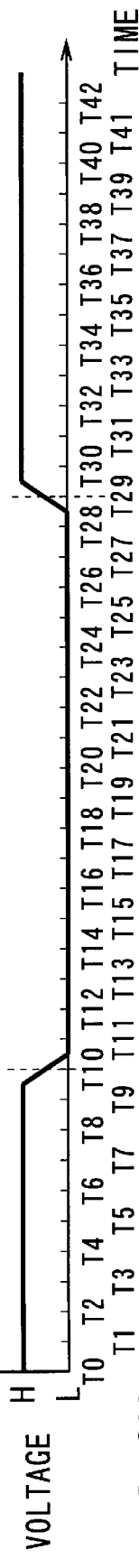
Figure 2H:
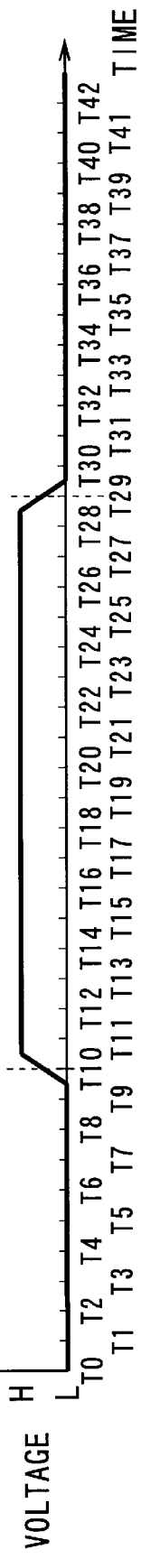

Preferred embodiments of the present invention will be described in detail below while referring to the drawings attached.

First Embodiment

As shown in FIG. 4, an output circuit of a DRAM with the EDO function according to a first embodiment of the present invention is comprised of a transfer gate section including first and second transfer gates 101 and 102, a precharge section including first and second precharge transistors 103 and 104, a latch section including first and second latches 105 and 106, a control section including a controller 107, a driver section including first and second drivers 106 and 109 and an inverter 115, and an output section including first and second output transistors 110 and 111.

The control section controls the transfer gate section, the precharge section, and the latch section. The driver section drives the output section.

The first transfer gate 101 of the transfer gate section is formed by a p-channel MOSFET 101a and an n-channel MOSFET 101b. Sources of the MOSFETs 101a and 101b are coupled together to be connected to a first input terminal $T_{11}$. Drains of the MOSFETs 101a and 101b are coupled together to be connected to a first nodes 1.

The second transfer gate 102 of the transfer gate section is formed by a p-channel MOSFET 102a and an n-channel MOSFET 102b. Sources of the MOSFETs 102a and 102b are coupled together to be connected to a second input terminal $T_{12}$. Drains of the MOSFETs 102a and 102b are coupled together to be connected to a second node 2.

The first input terminal $T_{11}$ is connected to a first read bus (not shown) of the DRAM and is applied with a first read-bus data signal RBST. The second input terminal $T_{12}$ is connected to a second read bus (not shown) of the DRAM and is applied with a second read-bus data signal RBSN. The second read-bus data signal RBSN is complementary to the first read-bus data signal RBST and therefore, one of them is in the high logic state H while the other is in the low logic state L.

The controller 107 of the control section has four inverters 112, 107a, 113, and 114, a capacitor 107b, and a NAND gate 107c. In the controller 107, the inverter 112 serves as a buffer, and the combination of the inverter 107a, the capacitor 107b, and the NAND gate 107c serves as a one-shot pulse generator used for a precharge signal generator.

An input of the inverter 112 is connected to a third input terminal $T_{13}$ and an output of the inverter 112 is connected to a node 3. An input of the inverter 107a is connected to the output of the inverter 112 through the node 3. An output of the inverter 107a is connected to a node 4. One of a pair of electrodes of the capacitor 107b is connected to the output of the inverter 107a through the node 4. The other of the pair of electrodes of the capacitor 107b is connected to the ground.

An input of the inverter 113 is connected to the output of the inverter 107a and the capacitor 107b through the node 4. An output of the inverter 113 is connected to a node 5.

Gates of the p-channel MOSFET 101a of the first transfer gate 101 and the p-channel MOSFET 102a of the second transfer gate 102 are commonly connected to the output of the inverter 107a through the node 4. Gates of the n-channel MOSFET 101b of the first transfer gate 101 and the n-channel MOSFET 102b of the second transfer gate 102 are commonly connected to the output of the inverter 113 through the node 5.

A first input of the NAND gate 107c is connected to the output of the inverter 107a and the capacitor 107b through the node 4. A second input of the NAND gate 107c is connected to the output of the inverter 112 through the node 3. An output of the NAND gate 107c is connected to a node 6.

Gates of the p-channel precharge MOSFETs 103 and 104 of the precharge section are commonly connected to the output of the NAND gate 107c through the node 6.

An input of the inverter 114 in connected to the output of the inverter 112 through the node 3. An output of the inverter 114 is connected to a node 7.

Gates of the p-channel MOSFET 105c of the first latch 105 and the p-channel MOSFET 106c of the second latch 106 are commonly connected to the output of the inverter 112 through the node 3. Gates of the n-channel MOSFET 105d of the first latch 105 and the p-channel MOSFET 106d of the second latch 106 are commonly connected to the output of the inverter 114 through the node 7.

The third input terminal $T_{13}$ is connected to a clock generator (not shown) of the DRAM and is applied with a transfer control signal φ.

The inverter 107a outputs a transfer-gate control signal TG to the NAND gate 107c and the gates of the p-channel MOSFETs 101a and 102a according to the applied transfer control signal φ. The inverter 113 outputs an inverted transfer-gate control signal $\overline{TG}$ to the gates of the n-channel MOSFETs 101b and 102b according to the applied transfer-gate control signal TG.

The first and second transfer gates 101 and 102 are controlled by the transfer-gate control signal TG and the inverted transfer-gate control signal $\overline{TG}$, thereby transferring the applied first and second read-bus data signals RBST and RBSN to the first and second nodes 1 and 2, respectively.

The first precharge transistor 103 is formed by a p-channel MOSFET. A drain of the p-channel MOSFET 103 is connected to a power supply line applied with a power supply voltage $V_{DD}$. A source of the MOSFET 103 is connected to the coupled drains of the n- and p-channel MOSFETs 101a and 101b of the first transfer gate 101 through the first node 1. A gate of the MOSFET 103 is connected to the output of the NAND gate 107c through the node 6.

The second precharge transistor 104 also is formed by a p-channel MOSFET. A drain of the p-channel MOSFET 104 is connected to the power supply line of $V_{DD}$. A source of the MOSFET 104 is connected to the coupled drains of the n- and p-channel MOSFETs 102a and 102b of the second transfer gate 102 through the second node 2. A gate of the MOSFET 104 is connected to the output of the NAND gate 107c through the node 6.

The inverter 107a, the capacitor 107b, and the NAND gate 107c of the controller 107, which constitute a one-shot pulse generator, serve as the precharge signal generator. The waveform of the transfer-gate control signal TG, which is outputted by the inverter 107a, becomes dull due to the existence of the capacitor 107b, thereby generating a one-shot pulse PRE by the NAND gate 107c as a precharge signal. This precharge signal PRE is commonly inputted into the gates of the precharge MOSFETs 103 and 104 through the node 6.

When the precharge signal PRE is inputted into the gates of the precharge MOSFETs 103 and 104, the first and second precharge MOSFETs 103 and 104 precharge the first and second nodes 1 and 2 to the power supply voltage $V_{DD}$, i.e., to the high logic state H, respectively. As explained later, this precharge signal PRE is generated to be synchronized with the fall of the transfer control signal φ. Therefore, the precharge behavior of the precharge MOSFETs 103 and 104 is carried out immediately before the first and second read-bus data signals RBST and RBSN are transferred to the first and second nodes 1 and 2 through the first and second transfer gates 101 and 102, respectively.

The first latch 105 is formed by two inverters 105a and 105b, a p-channel MOSFET 105c, and an n-channel MOSFET 105d. The inverters 105a and 105b are connected in cascade to make a loop, thereby constituting a first flip-flop. An input and an output of the inverter 105a are connected to the first node 1 and an input of the inverter 105b, respectively. An output of the inverter 105b is connected to the first node 1.

The p-channel MOSFET 105c is connected to the power supply side of the inverter 105b and the n-channel MOSFET 105d is connected to the ground side of the inverter 105b. Specifically, a drain of the p-channel MOSFET 105c in connected to the power supply line of $V_{DD}$. A source of the MOSFET 105c is connected to a terminal of the inverter 105b. A gate of the MOSFET 105c is connected to the output of the inverter 112 through the node 3. A source of the n-channel MOSFET 105d is connected to the ground. A drain of the MOSFET 105d is connected to another terminal of the inverter 105b. A gate of the MOSFET 105d is connected to the output of the inverter 114 through the node 7.

The second latch 106 is formed by two inverters 106a and 106b, a p-channel MOSFET 106c, and an n-channel MOSFET 106d. The inverters 106a and 106b are connected in cascade to make a loop, thereby constituting a second flip-flop. An input and an output of the inverter 106a are connected to the second node 2 and an input of the inverter 106b, respectively. An output of the inverter 106b is connected to the second node 2.

The p-channel MOSFET 106c is connected to the power supply side of the inverter 106b and the n-channel MOSFET 106d is connected to the ground side of the inverter 106b. Specifically, a drain of the p-channel MOSFET 106c is connected to the power supply line of $V_{DD}$. A source of the MOSFET 106a is connected to a terminal of the inverter 106b. A gate of the MOSFET 106c is connected to the output of the inverter 112 through the node 3. A source of the n-channel MOSFET 106d is connected to the ground. A drain of the MOSFET 106d is connected to another terminal of the inverter 106b. A gate of the MOSFET 106d is connected to the output of the inverter 114 through the node 7.

The first latch 105 serves to temporarily hold or latch the applied first read-bus data signal RBST at the first node 1. The first read-bus data signal RBST thus latched in the first latch 105 is termed a first read-bus data signal RBST', The second latch 106 serves to temporarily hold or latch the applied second read-bus data signal RBSN at the second node 2. The second read-bus data signal RBSN thus latched in the second latch 106 is termed a second read-bus data signal RBSN'.

The MOSFETs 105c, 105d, 106c, and 106d serve to accelerate the precharge behavior carried out by the first and second precharge MOSFETs 103 and 104 and to restrict the precharge current. Therefore, these MOSFETs 105c, 105d, 106c, and 106d may be canceled for simplification.

The first driver 108 of the driver section is formed by a NOR gate 108a and an inverter 108b. A first input of the NOR gate 108a is connected to the output of the first transfer gate 101 through the first node 1. A second input of the NOR gate 108a is connected to an output of the inverter 115 through a node 8. An output of the NOR gate 108a is connected to an input of the inverter 108b. An output of the inverter 108b is connected to a gate of the p-channel output MOSFET 110 of the output section.

The second driver 109 of the driver section is formed by a NOR gate 109a. A first input of the NOR gate 109a is connected to the output of the second transfer gate 102 through the second node 2. A second input of the NOR gate 109a is connected to the output of the inverter 115 through the node 8. An output of the NOR gate 109a is connected to a gate of the n-channel output MOSFET 111 of the output section.

An input of the inverter 115 is connected to a fourth input terminal $T_{14}$ to which au output-enable signal OE is applied. The inverter 115 serves as a buffer circuit for the signal OE. The inverter 115 outputs an inverted output-enable signal $\overline{OE}$ according to the applied signal OE to the second inputs of the NOR gates 108a and 109a.

In response to the first latched read-bus data signal RBST' and the inverted output-enable signal $\overline{OE}$, the first driver 108 outputs a first output signal OUTT to the gate of the p-channel MOSFET 110. In response to the second latched read-bus data signal RBSN' and the inverted output-enable signal $\overline{OE}$, the second driver 109 outputs a second output signal OUTN to the gate of the n-channel MOSFET 111.

A source of the p-channel MOSFET 110 of the output section is connected to the power supply line of $V_{DD}$. A drain of the MOSFET 110 is connected to a drain of the n-channel MOSFET 111. A source of the MOSFET 111 is connected to the ground. The gate of the MOSFET 110 is connected to the output of the inverter 108b of the first driver 108. The gate of the MOSFET 111 is connected to the output of the NOR gate 109a of the second driver 109. The coupled drains of the MOSFETs 110 and 111 are connected to an output terminal $T_{13}$ through which an output data signal DOUT is derived.

When the first driving signal OUTT of the first driver 108 is in the high logic state H, the p-channel output MOSFET 110 is turned OFF. When the first driving signal OUTT is in the low logic stage L, the p-channel output MOSFET 110 is turned ON. On the other hand, when the second driving signal OUTN of the second driver 109 is in the high logic state H, the n-channel output MOSFET 111 is turned ON. When the second driving signal OUTN is in the low logic state L, the n-channel output MOSFET 111 is turned OFF.

Accordingly, when the p-channel MOSFET 110 is ON and the n-channel output MOSFET 111 is OFF, the output data signal DOUT is equal to the power supply voltage $V_{DD}$, ie., the output data signal DOUT is in the high logic state H. When the n-channel output MOSFET 111 is ON and the p-channel output MOSFET 110 is OFF, the output data signal DOUT is equal to the ground potential or zero, i.e., the output data signal DOUT is in the low logic state L.

Next, the operation of the output circuit according to the first embodiment shown in FIG. 4 is explained below with reference to FIGS. 5A to 5M, which show the waveforms of the signals used in the this output circuit. In FIGS. 5A to 5M, the characters T0 to T42 denote arbitrary times.

Here, it is supposed that the signal RAS has been already activated and that the desired row address has been already fetched and the data corresponding to the selected row address have been amplified by a sense amplifier (not shown). A data corresponding to a column specified by the signal CAS is selected from the data corresponding to the selected row address and is transmitted to the first and second read bus lines.

Figure 5A:
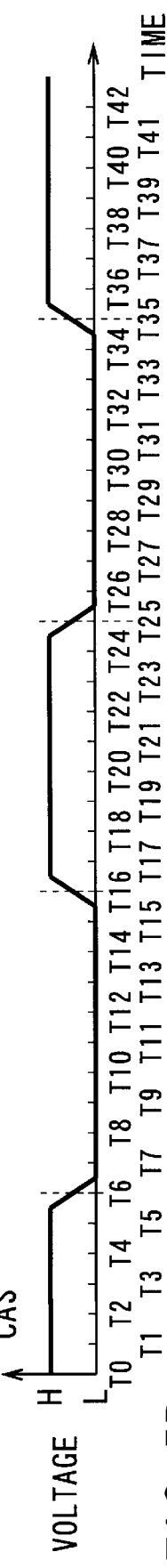
Figure 5B:
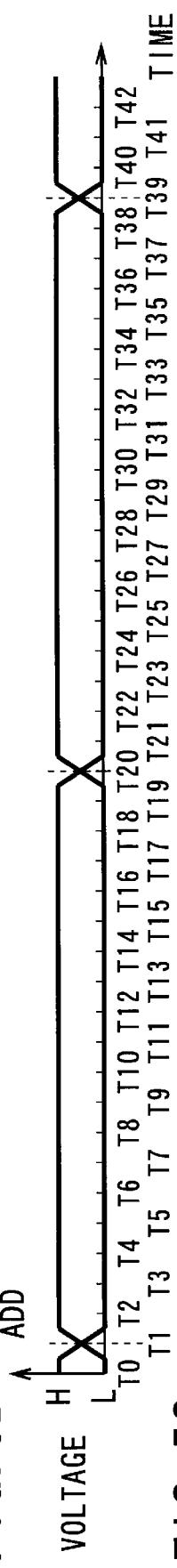
Figure 5C:
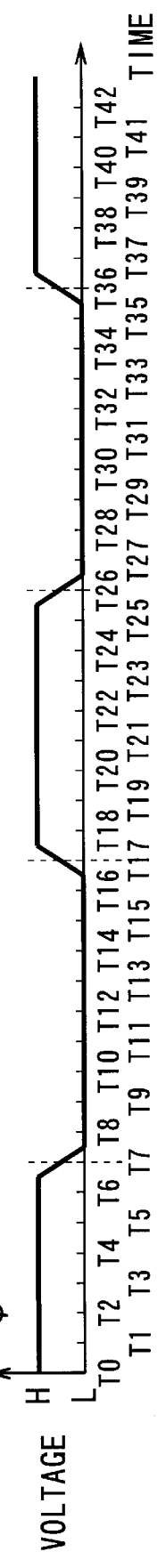
Figure 5F:
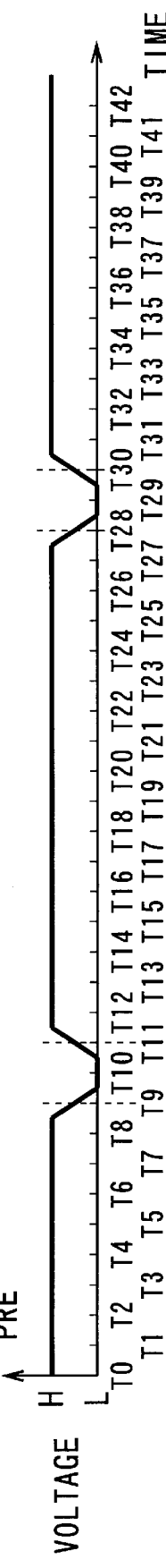
Figure 5G:
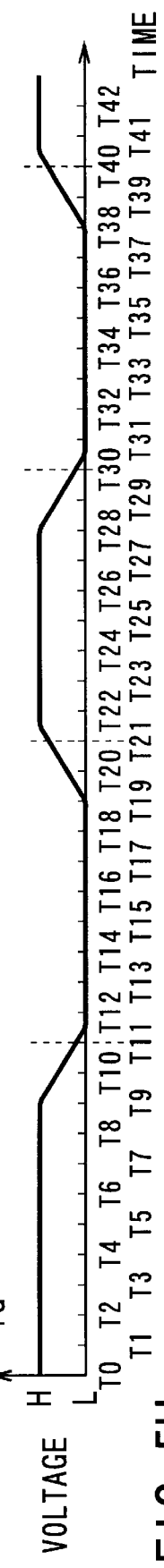
Figure 5H:
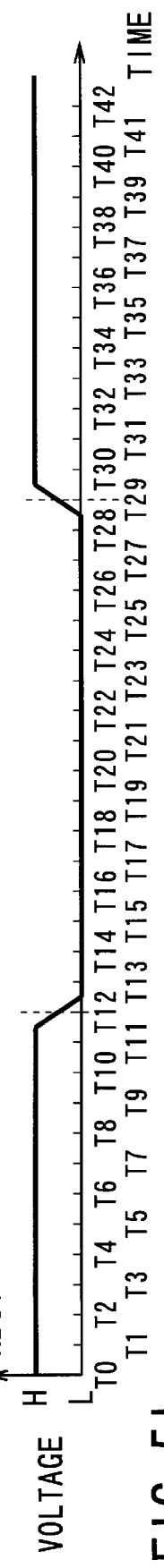
Figure 5I:
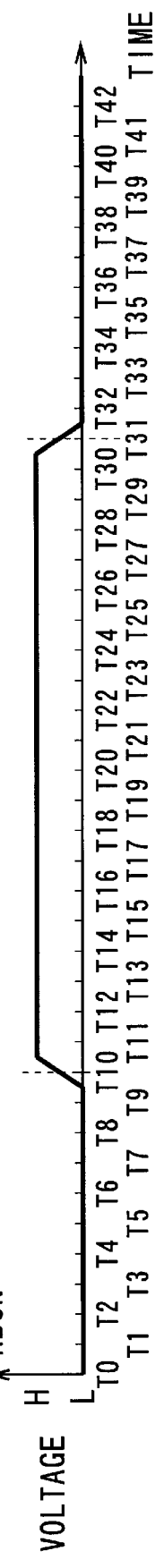

FIG. 5A shows the external clock signal CAS. FIG. 5B shows a column address signal ADD. FIG. 5C shows the transfer control signal φ applied to the third input terminal $T_{13}$, which is synchronized with the signal CAS in FIG. 5A. FIGS. 5D and 5E show the first and second read-bus data signals RBST and RBSN transmitted through the first and second input terminals $T_{11}$ and $T_{12}$, respectively, in which these signals RBST and RBSN are complementary. FIG. 5F shows the precharge signal PRE, which is generated from the transfer control signal φ. FIG. 5G shows the transfer-gate control signal TG, which is generated from the transfer control signal φ. FIGS. 5H and 5I show the first and second read-bus data signals RBST' and RBSN' latched in the first and second latches 105 and 106, respectively, in which these signals RBST' and RBSN' are complementary. FIG. 5J shows the output-enable signal OE. FIGS. 5K and 5L show the first and second driving signals OUTT and OUTN, respectively. FIG. 5M shows the output data signal DOUT.

If the column address signal ADD is activated (i.e., turned from the low logic state L to the high logic state H) at the time T1, as shown in FIG. 5B, the second input terminal $T_{12}$ connected to the second read bus is precharged to the power supply voltage $V_{DD}$. Thus, the second read-bus data signal RBSN is turned from the low logic state L to the high logic state H at the time T3, as shown in FIG. 5E. At this time, the fist read-bus data signal RBST is kept at the high logic state H, as shown in FIG. 5D.

Then, at the time T5, the first read-bus data signal REST is turned from the logic state H to the logic state L, as shown in FIG. 5D because of a new data has been read out.

When the external clock signal CAS is turned from the logic state H to the logic state L (i.e., activated) at the time T6 according to the column address signal ADD, the transfer control signal φ is turned to the logic state L at the time T7. Due to the transfer control signal φ, as shown in FIG. 5F, the precharge signal PRE is turned from the logic state H to the logic state L at the time T9 and then, it is returned from the logic state L to the logic state H at the time T11.

Thus, the precharge signal PRE is in the form of a one-shot pulse having a pulse width approximately equal to the time difference between the inverted transfer control signal $\overline{\phi}$ and the transfer-gate control signal TG applied to the first and second inputs of the NAND gate 107c, respectively.

After the precharge signal PRE is turned from the logic state H to the logic state L (i.e., activated) at the time T9, the latched second read-bus data signal RBSN' is turned from the logic state L to the logic state H at the time T10, as shown in FIG. 5I. This is caused by the precharge behavior by the precharge MOSFETs 103 and 104. Since the latched first read-bus data signal RBST' has been in the logic state H, this data signal RBST' is kept unchanged at the time T10, as shown in FIG. 5H.

Due to the turning of the latched second read-bus data signal RBSN', the second driving signal OUTN is turned to the logic state L at the time T11, as shown in FIG. 5L. Thus, the n-channel output MOSFET 111 is turned OFF. At this time, the first driving signal OUTT is in the logic state H, as shown in FIG. 5K and therefore, the p-channel output MOSFET 111 is kept in the OFF state.

Due to the turning of the transfer-gate control signal TG to the logic state L at the time T11, the first and second transfer gates 101 and 102 are opened to thereby transfer the first and second read-bus data signals RBST and RBSN to the first and second nodes 1 and 2, respectively, as shown in FIGS. 5H and 5I. Thus, the first read-bus data signal RBST' latched at the fist node 2 is turned from the logic level H to the logic level L at the time T12. At this time, the second read-bus data signal RBSN' latched at the second node 2 is in the logic level H.

Due to the turning of the latched first read-bus data signal REST', the first driving signal OUTT is turned from the logic state H to the logic state L at the time T14. Thus, the p-channel MOSFET 110 is turned to the ON state at the time T16 while the n-channel MOSFET 111 is kept in OFF state. The first and second driving signals OUTT and OUTN are not affected by the output-enable signal OE, because the output-enable signal OE is fixed at the logic state H, as shown in FIG. 5J.

As a result, the output data signal DOUT is turned from the logic state L to the logic state H at the time T16, as shown in FIG. 5M.

The external clock signal CAS is turned to the logic state L (i.e., the signal CAS is reset) at the time T16. In response to this change of the external clock signal CAS, the transfer control signal φ is turned to the logic state H at the time T17. Due to the change of the transfer control signal φ, the transfer-gate control signal TG is turned to the logic state H at the time T21, thereby separating the first and second read buses from the first and second latches 105 and 106. At this stage, the first and second read-bus data signals RBST' and RBSN' are latched by these flip-flops 105 ad 106 and therefore, the output data signal DOUT is kept unchanged. This means that the EDO function is realized.

To start a next read out cycle, the column address signal ADD is activated (i.e., turned from the logic state L to the logic state H, or turned from the logic state H to the logic state L) at the time T20. Then, the first read-bus data signal RBST is turned from the logic state L to the logic state H at the time T22. At this time, the second read-bus data signal RBSN is kept at the logic state H.

Then, at the time T24, the second read-bus data signal RBSN is turned from the logic state H to the logic state L.

When the external clock signal CAS is turned from the logic state H to the logic state L (i.e., activated) at the time T25 according to the column address signal ADD, the transfer control signal φ is turned to the logic state L at the time T26. Due to the transfer control signal φ, as shown In FIG. 5F, the precharge signal PRE is turned from the logic state H to the logic state L at the time T28 and then, it is returned from the logic state L to the logic state H at the time T30.

Thus, the precharge signal PRE is in the form of a one-shot pulse having a pulse width approximately equal to the time difference between the inverted transfer control signal $\overline{\phi}$ and the transfer-gate control signal TG applied to the first and second inputs of the NAND gate 107c, respectively.

After the precharge signal PRE is turned from the logic state H to the logic state L (i.e., activated) at the time T28, the first read-bus data signal RBST' is turned from the logic state L to the logic state H at the time T29, as shown in FIG. 5H. This is caused by the precharge behavior by the precharge MOSFETs 103 and 104, Since the second read-bus data signal RBSN' has been in the logic state H, this data signal RBSN' is kept unchanged at the time T29, as shown in FIG. 5I.

Due to the turning of the first read-bus data signal RBST', the first driving signal OUTT is turned to the logic state H at the time T31, as shown in FIG. 5K. Thus, the p-channel output MOSFET 110 is turned OFF. At this time, the second driving signal OUTN is in the logic state L, as shown in FIG. 5L. Therefore, the n-channel output MOSFET 111 is kept in the OFF state.

Due to the turning of the transfer-gate control signal TG to the logic state L at the time T30, the first and second transfer gates 101 and 102 are opened to thereby transfer the first end second read-bus data signals RBST and RBSN to the first and second nodes 1 and 2, respectively, as shown in FIGS. 5H and 5I. Thus, the second read-bus data signal RBSN' latched at the second node 2 is turned from the logic state H to the logic state L at the time T31. At this time, the first read-bus data signal RBST' latched at the first node 1 is in the logic state H.

Due to the turning of the latched second read-bus data signal RBSN', the second driving signal OUTN is turned from the logic state H to the logic state L at the time T32. Thus, the n-channel MOSFET 111 is turned to the ON state at the time T34 while the p-channel. MOSFET 110 is kept in OFF state. The first and second driving signals OUTT and OUTN are not affected by the output-enable signal OE, because the output-enable signal OE is fixed at the high logic state H, as shown in FIG. 5J.

As a result, the output data signal DOUT is turned from the logic state H to the logic state L at the time T34, as shown in FIG. 5M.

Subsequently, to read out a next data, the external clock signal CAS is turned to the logic state H (or, reset) at the time T35. In response to this change of the signal CAS, the transfer control signal $\phi$ is turned to the logic state H at the time T36. Due to the change of the transfer control signal $\phi$, the transfer-gate control signal TG is turned to the logic state H at the time T40, thereby separating the first and second read buses from the first and second latches 105 and 106. At this stage, the first and second read-bus data signals RBST' and RBSN' are latched by the first and second latches 105 ad 106 and therefore, the output data signal DOUT is kept unchanged for the purpose of the EDO function.

After the time T39 at which the address signal ADD is turned, the same procedure as above is repeated for the second read-out cycle.

As explained in detail above, with the output circuit of a DRAM according to the first embodiment in FIG. 4, the latched second read-out data signal RBSN' is turned from the high logic state H to the low logic state L after the first node 1 is turned to the high logic state H due to the precharge behavior. Therefore, the second driving signal OUTN is turned from the logic state L to the logic state H (i.e., the n-channel output MOSFET 111 is turned ON) after the first driving signal OUTT is turned from the logic state L to the logic state H (i.e., the p-channel output MOSFET 110 is turned OFF).

As a result, the ON-ON state of the output MOSFETs 110 and 111 is prevented from occurring even if some difference exists between the transfer times of the first and second read-out data signals RBST and RBSN to the output MOSFETs 110 and 111. Consequently, no current flows through these MOSFETs 110 and 111 due to their ON-ON state.

Because no current flows through the output MOSFETs 110 and 111 due to their ON-ON state, the electric potential of the power supply line ($V_{DD}$) and the ground line (GND) are prevented from fluctuating, resulting in improvement of the access speed of the semiconductor memory device.

Moreover, since the precharge signal PRE is generated in the output circuit according to the first embodiment with the use of the transfer-gate control signal $\phi$, no timing deviation takes place due to the "skew". Consequently, the adjustment or design of the pulse width of control signals is facilitated.

Second Embodiment

Figure 6:
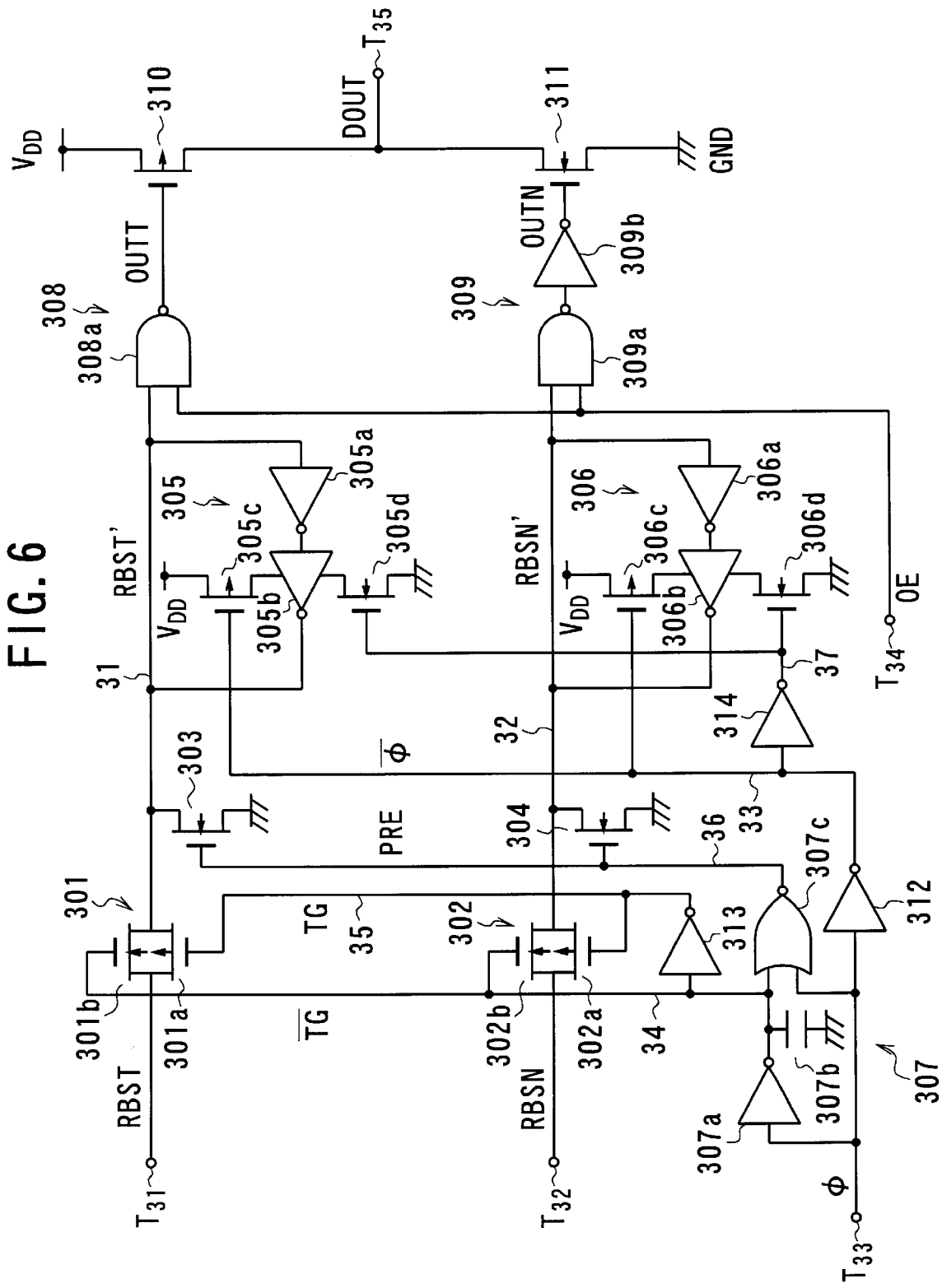
FIG. 6 is a block diagram showing the circuit configuration of an output circuit of a semiconductor memory device with the EDO function according to a second embodiment of the present invention.

FIG. 6 shows an output circuit of a DRAM with the EDO function according to a second embodiment of the present invention, in which a pair of precharge transistors precharge the first and second nodes to the ground potential (GND), unlike the power supply voltage $V_{DD}$.

The output circuit according to the second embodiment has substantially the same configuration and operation as those of the first embodiment except for the configuration relating to the precharge behavior to the ground potential.

As shown in FIG. 6, the output circuit according to the second embodiment is comprised of a transfer gate section including first and second transfer gates 301 and 302, a precharge section including first and second precharge transistors 303 and 304, a latch section including first and second latches 305 and 306, a control section including a controller 30, a driver section including first and second drivers 308 and 309, and an output section including first and second output transistors 310 and 311.

The control section controls the transfer gate section, the precharge section, and the latch section. The driver section drives the output section.

The first transfer gate 301 of the transfer gate section is formed by a p-channel MOSFET 301a and an n-channel MOSFET 301b. Sources of the MOSFETs 301a and 301b are coupled together to be connected to a first input terminal $T_{31}$. Drains of the MOSFETs 301c and 301b are coupled together to be connected to a first node 31.

The second transfer gate 302 of the transfer gate section is formed by a p-channel MOSFET 302a and an n-channel MOSFET 302b. Sources of the MOSFETs 302a and 302b are coupled together to be connected to a second input terminal $T_{32}$. Drains of the MOSFETs 302a and 302b are coupled together to be connected to a second node 32.

The first input terminal $T_{31}$ is connected to a first read bus (not shown) of the DRAM and is applied with a first read-bus data signal RBST. The second input terminal $T_{32}$ is connected to a second read bus (not shown) of the DRAM and is applied with a second read-bus data signal RBSN. The second read-bus data signal RBSN is complementary to the first read-bus data signal RBST and therefore, one of them is in the high logic state H while the other is in the low logic state L.

The controller 307 of the control section has four inverters 312, 307a, 313, and 314, a capacitor 307b, and a NOR gate 307c. In the controller 307, the inverter 312 serves as a buffer, and the combination of the inverter 307a, the capacitor 307b, and the NOR gate 307c serves as a one-shot pulse generator for a precharge signal generator.

An input of the inverter 312 is connected to a third input terminal T$_{33}$ and an output of the inverter 312 is connected to a node 33. An input of the inverter 307a is connected to the third input terminal T$_{33}$. An output of the inverter 307a is connected to a node 34. One of a pair of electrodes of the capacitor 307b is connected to the output of the inverter 307a through the node 34. The other of the pair of electrodes of the capacitor 307b is connected to the ground.

An input of the inverter 313 is connected to the output of the inverter 307a and the capacitor 307b through the node 34 An output of the inverter 313 is connected to a node 35.

Gates of the p-channel MOSFET 301a of the first transfer gate 301 and the p-channel MOSFET 302a of the second transfer gate 302 are commonly connected to the output of the inverter 313 through the node 35. Gates of the n-channel MOSFET 301b of the first transfer gate 301 and the n-channel MOSFET 302b of the second transfer gate 302 are commonly connected to the output of the inverter 307a through the node 34.

A first input of the NOR gate 307c is connected to the output of the inverter 307a and the capacitor 307b through the node 34. A second input of the NOR gate 307c is connected to the output of the input terminal T$_{33}$. An output of the NOR gate 307c is connected to a node 36.

Gates of the n-channel precharge MOSFETs 303 and 304 of the precharge section are commonly connected to the output of the NOR gate 307c through the node 36.

An input of the inverter 314 is connected to the output of the inverter 312 through the node 33. An output of the inverter 314 is connected to a node 37.

Gates of the p-channel MOSFET 305c of the first flip-flop 305 and the p-channel MOSFET 306c of the second flip-flop 306 are commonly connected to the output of the inverter 312 through the node 33. Gates of the n-channel MOSFET 305d of the first flip-flop 305 and the p-channel MOSFET 306d of the second flip-flop 306 are commonly connected to the output of the inverter 314 through the node 37.

The third input terminal T$_{33}$ is connected to a clock generator (not shown) of the DRAM and is applied with a transfer-gate control signal φ.

The inverter 307a outputs an inverted transfer-gate control signal $\overline{TG}$ to the NOR gate 307c and the gates of the n-channel MOSFETs 301b and 302b according to the applied transfer control signal φ. The inverter 313 outputs a transfer-gate control signal TG to the gates of the p-channel MOSFETs 301b and 302b according to the applied inverted transfer-gate control signal $\overline{TG}$.

The first and second transfer gates 301 and 302 are controlled by the inverted transfer-gate control signal $\overline{TG}$ and the transfer-gate control signal TG, thereby transferring the applied first and second read-bus data signals RBST and RBSN to the first and second nodes 31 and 32, respectively.

Unlike the first embodiment, the first precharge transistor 303 is formed by an n-channel MOSFET. A source of the n-channel MOSFET 303 is connected to the ground. A drain of the MOSFET 303 is connected to the coupled drains of the n- and p-channel MOSFETs 301a and 301b of the first transfer gate 301 through the first node 31. A gate of the MOSFET 303 is connected to the output of the NOR gate 307c through the node 36.

The second precharge transistor 304 also is formed by an n-channel MOSFET. A source of the n-channel MOSFET 304 is connected to the ground. A drain of the MOSFET 304 is connected to the coupled drains of the n- and p-channel MOSFETs 302a and 302b of the second transfer gate 302 through the second node 32. A gate of the MOSFET 304 is connected to the output of the NOR gate 307c through the node 36.

The inverter 307a, the capacitor 307b, and the NOR gate 307c of the controller 307 constitute a one-shot pulse generator serving as the precharge signal generator. The waveform of the inverted transfer-gate control signal $\overline{TG}$, which is outputted by the inverter 307a, becomes dull due to the existence of the capacitor 307b, thereby generating a one-shot pulse PRE by the NOR gate 307c as a precharge signal. This precharge signal PRE is commonly inputted into the gates of the first and second precharge MOSFETs 303 and 304 through the node 36.

When the precharge signal PRE is inputted into the gates of the precharge MOSFETs 303 and 304, the precharge MOSFETs 303 and 304 precharge the first and second nodes 31 and 32 to the ground potential. i. e., to the low logic level L, respectively. As explained later, this precharge signal PRE is generated to be synchronized with the fall of the transfer control signal φ. Therefore, the precharge behavior is carried out immediately before the first and second read-bus data signals RBST and RBSN are transferred to the first and second nodes 31 and 32 through the first and second transfer gates 301 and 302, respectively.

The first latch 305 is formed by two inverters 305a and 305b, a p-channel MOSFET 305c, and an n-channel MOSFET 305d. The inverters 305a and 305b are connected in cascade to make a loop, thereby constituting a first flip-flop, An input and an output of the inverter 305a are connected to the first node 31 and an input of the inverter 305b, respectively. An output of the inverter 305b is connected to the first node 31.

The p-channel MOSFET 305c is connected to the power supply side of the inverter 305b and the n-channel MOSFET 305d is connected to the ground side of the inverter 305b. Specifically, a drain of the p-channel MOSFET 305c is connected to the power supply line Of V$_{DD}$. A source of the MOSFET 305c is connected to a terminal of the inverter 305b. A gate of the MOSFET 305c is connected to the output of the inverter 312 through the node 33. A source of the n-channel MOSFET 305d is connected to the ground. A drain of the MOSFET 305d is connected to another terminal of the inverter 305b. A gate of the MOSFET 305d is connected to the output of the inverter 314 through the node 37.

The second latch 306 is formed by two inverters 306a and 306b, a p-channel MOSFET 306c, and an n-channel MOSFET 306d. The inverters 306a and 306b are connected in cascade to make a loop, thereby constituting a second flip-flop. An input and an output of the inverter 306a are connected to the second node 32 and an input of the inverter 306b, respectively. An output of the inverter 306b is connected to the second node 32.

The p-channel MOSFET 306c is connected to the power supply side of the inverter 306b and the n-channel MOSFET 306d is connected to the ground side of the inverter 306b. Specifically, a drain of the p-channel MOSFET 306c is connected to the power supply line of V$_{DD}$. A source of the MOSFET 306c is connected to a terminal of the inverter 306b. A gate of the MOSFET 306c is connected to the output of the inverter 312 through the node 33. A source of the n-channel MOSFET 306d is connected to the ground. A drain of the MOSFET 306d is connected to another terminal of the inverter 306b. A gate of the MOSFET 306d is connected to the output of the inverter 314 through the node 37.

The first latch 305 temporarily holds or latches the applied first read-bus data signal RBST at the first node 31. The read-bus data signal RBST thus latched in the first latch 305 is termed a first read-bus data signal RBST'.

The second latch 306 temporarily holds or latches the applied second read-bus data signal RBSN at the second node 32. The read-bus data signal RBSN thus latched in the second latch 306 is termed a second read-bus data signal RBSN'.

The MOSFETs 305c, 305d, 306c, and 306d serve to accelerate the precharge behavior carried out by the precharge MOSFETs 303 and 304 and to restrict the precharge current. Therefore, these MOSFETs 305c, 305d, 306c, and 306d may be canceled for simplification.

The first output driver 308 of the driver section is formed by a NAND gate 308a. A first input of the NAND gate 308a is connected to the output of the first transfer gate 301 through the first node 31. A second input of the NAND gate 308a is connected to a fourth input terminal $T_{34}$. An output of the NAND gate 308a is connected to a gate of the p-channel output MOSFET 310 of the output section.

The second driver circuit 309 of the output driver section is formed by a NAND gate 309a and an inverter 309b. A first input of the NAND gate 309a is connected to the output of the second transfer gate 302 through the second node 32. A second input of the NAND gate 309a is connected to the fourth input terminal $T_{34}$. An output of the NAND gate 309a is connected to an input of the inverter 309b. An output of the inverter 309b is connected to a gate of the n-channel output MOSFET 311 of the output section.

The fourth input terminal $T_{34}$ is applied with an output-enable signal OE. The output-enable signal OE is applied to the second inputs of the NAND gates 308a and 309a.

In response to the latched first read-bus data signal RBST' and the output-enable signal OE, the first driver 308 outputs a first driving signal OUTT to the gate of the p-channel MOSFET 310. In response to the latched second read-bus data signal RBSN' and the output-enable signal OE, the second driver 309 outputs a second driving signal OUTN to the gate of the n-channel MOSFET 311.

A source of the p-channel MOSFET 310 of the output section is connected to the power supply line of $V_{DD}$. A drain of the MOSFET 310 is connected to a drain of the n-channel MOSFET 311. A source of the MOSFET 311 is connected to the ground. The gate of the MOSFET 310 is connected to the output of the NAND gate 308a of the first driver 308. The gate of the MOSFET 311 is connected to the output of the inverter 309b of the second driver 309. The coupled drains of the MOSFETs 310 and 311 are connected to an output terminal $T_{35}$ through which an output data signal DOUT is derived.

When the first driving signal OUTT of the first driver 308 is in the high logic state H, the p-channel output MOSFET 310 is turned OFF. When the first driving signal OUTT is in the low logic state L, the p-channel output MOSFET 310 is turned ON. On the other hand, when the second driving signal OUTN of the second driver 309 in the high logic state H, the n-channel output MOSFET 311 is turned ON. When the second driving signal OUTN is in the low logic state L, the n-channel output MOSFET 311 is turned OFF.

Accordingly, when p-channel MOSFET 310 is ON and the n-channel output MOSFET 311 is OFF, the output data signal DOUT is equal to the power supply voltage $V_{DD}$, i.e., the output data signal DOUT is in the high logic state H. When the n-channel output MOSFET 311 is ON and the p-channel output MOSFET 310 is OFF, the output data signal DOUT is equal to the ground potential or zero. i.e., the output data signal DOUT is in the low logic state L.

Next, the operation of the output circuit according to the second embodiment shown in FIG. 6 is explained below with reference to FIGS. 7A to 7M, which show the waveforms of the signals used in the this output circuit. In FIGS. 7A to 7M, the characters T0 to T42 denote arbitrary times.

The same supposition as that of the first embodiment is applied to the second embodiment also.

Figures 7D, 7E:
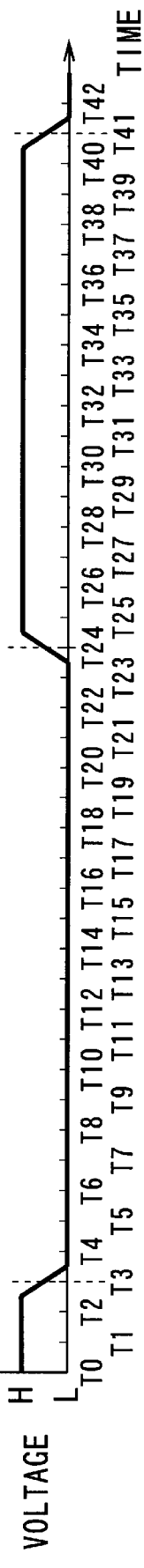

If the column address signal ADD is activated (i.e., turned from the low logic state L to the high logic state H) at the time T1, as shown in FIG. 7B, the second input terminal $T_{32}$ connected to the second read bus is precharged to the power supply voltage $V_{DD}$. Thus, the second read-bus data signal RBSN is turned from the logic state H to the logic state L at the time T3, as shown in FIG. 7E. At this time, the first read-bus data signal RBST is kept at the logic state L, as shown in FIG. 7D.

Then, at the time T5, the first read-bus data signal RBST is turned from the logic state L to the logic state H, as shown in FIG. 7D because of a new data.

When the external clock signal CAS is turned from the logic state H to the logic state L (i.e., activated) at the time T6 according to the column address signal ADD, the transfer control signal φ is turned to the logic state L at the time T7. Due to the transfer control signal φ, as shown in FIG. 7F, the precharge signal PRE is turned from the logic state L to the logic state H at the time T8 and then, it is returned from the logic state H to the logic state L at the time T10.

Thus, the precharge signal PRE is in the form of a one-shot pulse having a pulse width approximately equal to the time difference between the inverted transfer control signal $\bar{\phi}$ and the transfer-gate control signal TG applied to the first and second inputs of the NOR gate 307c, respectively.

After the precharge signal PRE is turned from the logic state H to the logic state L (i.e., activated) at the time T8, the latched second read-bus data signal RBSN' is turned from the logic state L to the logic state H at the time T9, as shown in FIG. 7I This is caused by the precharge behavior by the precharge MOSFETs 303 and 304. Since the first latched read-bus data signal RBST' has been in the logic state L, this data signal RBST' is kept unchanged at the time T9, as shown in FIG. 7H.

Figure 7J:
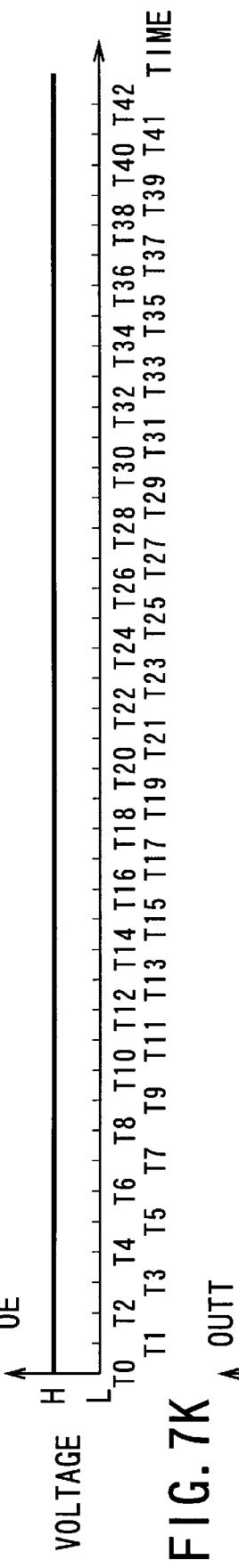
Figure 7K:
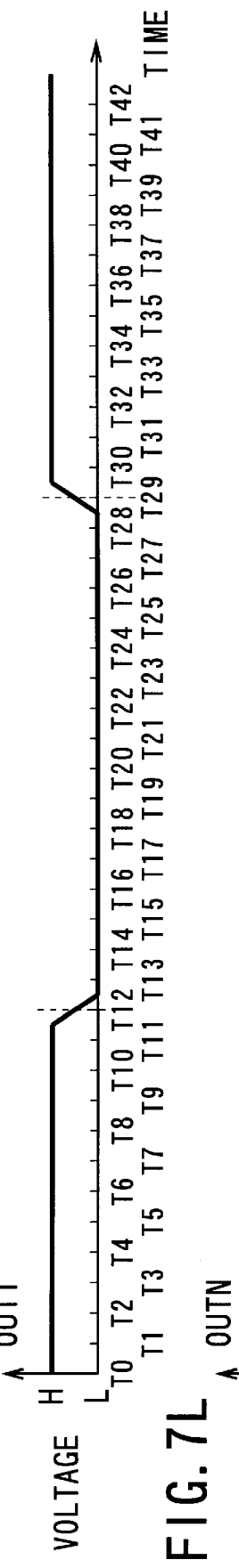
Figure 7L:
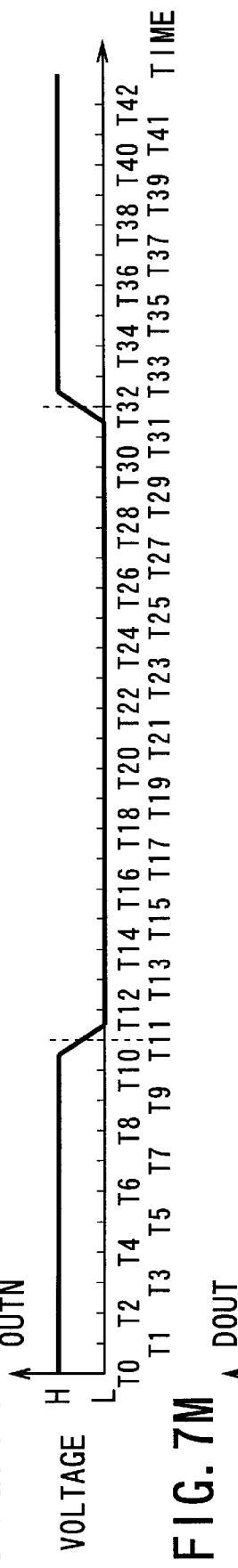

Due to the turning of the second read-bus data signal RBSN', the second driving signal OUTN is turned to the logic state L at the time T11, as shown in FIG. 7L. Thus, the n-channel output MOSFET 311 is turned OFF. At this time, the first driving signal OUTT is in the logic state H, as shown in FIG. 7K. Therefore, the p-channel output MOSFET 311 is kept in the OFF state.

On the other hand, due to the turning of the transfer-gate control signal TG to the logic state L at the time T10, the first and second transfer gates 301 and 302 are opened to thereby transfer the read-bus data signals RBST and RBSN to the first and second nodes 31 and 32, respectively, as shown in FIGS. 7H and 7I. Thus, the first read-bus data signal RBST' latched at the first node 31 is turned from the logic state L to the logic state H at the time T11. At this time, the second read-bus data signal RBSN' latched at the second node 32 has been in the logic state L.

Due to the turning of the first latched read-bus data signal RBST', the first driving signal OUTT is turned from the logic state H to the logic state L at the time T12. Thus, the p-channel MOSFET 310 is turned ON at the time T14 while the n-channel MOSFET 311 is kept OFF. The first and second driving signals OUTT and OUTN are not affected by the output-enable signal OE, because this signal OE is fixed at the logic state H, as shown in FIG. 7J.

Figure 7M:
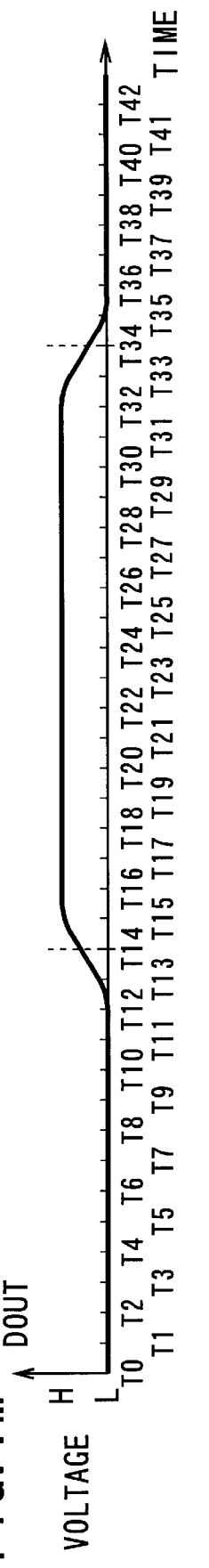

As a result, the output data signal DOUT is turned from the logic state L to the logic state H at the time T14, as shown in FIG. 7M.

The external clock signal CAS is turned to the logic state H (i.e., the signal CAS is reset) at the time T16. In response to this change of the external clock signal CAS, the transfer control signal φ is turned to the logic state H at the time T17. Due to the change of the transfer control signal φ, the transfer-gate control signal TG is turned to the logic state H at the time T20, thereby separating the first and second read buses from the first and second latches 305 and 306. At this stage, the first and second read-bus data signals RBST' and RBSN' are latched by these latches 305 ad 306 and therefore, the output data signal DOUT is kept unchanged even at the time T20. This means that the EDO function is realized.

To start a next read out cycle, the column address signal ADD is activated (i.e., turned from the logic state L to the logic state H, or turned from the logic state H to the logic state L) at the time T20. Then, the first read-bus data signal RBST is turned from the logic state L to the logic state H at the time T22. At this time, the second read-bus data signal RBSN is kept in the logic state L.

Then, at the time T24, the first read-bus data signal RBSN is turned from the logic state H to the logic state L due to the new data thus read out.

When the external clock signal CAS is turned from the logic state H to the logic state L (i.e., activated) at the time T25 according to the column address signal ADD, the transfer control signal φ is turned to the logic state L at the time T26. Due to the transfer control signal φ, as shown in FIG. 7F, the precharge signal PRE is turned from the logic state H to the logic state L at the time T27 and then, it is returned from the logic state L to the logic state H at the time T29.

Thus, the precharge signal PRE is in the form of a one-shot pulse having a pulse width approximately equal to the time difference between the inverted transfer control signal $\bar{\phi}$ and the transfer-gate control signal TG applied to the first and second inputs of the NOR gate 307c, respectively.

After the precharge signal PRE is turned from the logic state H to the logic state L (i.e., activated) at the time T27, the first latched read-bus data signal RBST' is turned from the logic state H to the logic state L at the time T28, as shown in FIG. 7H. This is caused by the precharge behavior by the precharge MOSFETs 303 and 304. Since the second latched read-bus data signal RBSN' has been in the logic state H, this data signal RBSN' is kept unchanged at the time T28, as shown in FIG. 7I.

Due to the turning of the first latched read-bus data signal RBST', the first driving signal OUTT is turned to the logic state H at the time T29, as shown in FIG. 7K. Thus, the p-channel output MOSFET 310 is turned OFF. At this time, the second driving signal OUTN is in the logic state L, as shown in FIG. 7L, and therefore, the n-channel output MOSFET 311 is kept OFF.

Due to the turning of the transfer-gate control signal TG to the logic state L at the time T29, the first and second transfer gates 301 and 302 are opened to thereby transfer the first and second read-bus data signals RBST and RBSN to the first and second nodes 31 and 32, respectively, as shown in FIGS. 7H and 7I. Thus, the second read-bus data signal RBSN' latched at the second node 32 is turned from the logic state L to the logic state H at the time T30. At this time, the first read-bus data signal RBST' latched at the first node 31 is in the logic state L.

Due to the turning of the second latched read-bus data signal RBSN', the second driving signal OUTN is turned from the logic state L to the logic state H at the time T32. Thus, the n-channel MOSFET 311 is turned ON at the time T34 while the p-channel MOSFET 310 is kept OFF. The first and second driving signals OUTT and OUTN are not affected by the output-enable signal OE, because the output-enable signal OE is fixed at the logic state H, as shown in FIG. 7J.

As a result, the output data signal DOUT is turned from the logic state H to the logic state L at the time T34, an shown in FIG. 7M.

Subsequently, the external clock signal CAS is turned to the logic state H (or, reset) at the time T35. In response to this change of the signal CAS, the transfer control signal φ is turned to the logic state H at the time T36. Due to the change of the transfer control signal φ, the transfer-gate control signal TG is turned to the logic state H at the time T39, thereby separating the first and second read buses from the first and second latches 305 and 306. At this stage, the first and second read-bus data signals RBST' and RBSN' are latched by the first and second latches 305 ad 306 and therefore, the output data signal DOUT is kept unchanged for the purpose of the EDO function.

After the time T39 at which the address signal ADD is turned, the name procedure as above is repeated for the second read-out cycle.

As explained in detail above, with the output circuit of a DRAM according to the second embodiment in FIG. 6, the second latched read-bus data signal RBSN' is turned from the high logic state H to the low logic state L after the first node 31 is turned to the low logic state L due to the precharge behavior. Therefore, the second driving signal OUTN is turned from the logic state L to the logic state H (i.e., the n-channel output MOSFET 311 is turned ON) after the first driving signal OUTT is turned from the logic state L to the logic state H (i.e., the p-channel output MOSFET 310 is turned OFF).

As a result, the ON-ON state of the p- and n-channel output MOSFETs 310 and 311 is prevented from occurring even if some difference exists between the transfer times of the first and second read-bus data signals RBST and RBSN to the first and second output MOSFETs 310 and 311. Consequently, no current flows through these MOSFETs 310 and 311 due to their ON-ON state.

Because no current flows through the output MOSFETs 310 and 311 due to their ON-ON state, the electric potential of the power supply line ($V_{DD}$) and the ground line (GND) are prevented from fluctuating, resulting in improvement of the access speed of the semiconductor memory device.

Moreover, since the precharge signal PRE is generated in the output circuit according to the second embodiment with the use of the transfer-gate control signal φ, no timing deviation takes place due to the "skew". Consequently, the adjustment or design of the pulse width of control signals is facilitated.

Third Embodiment

Figure 8:
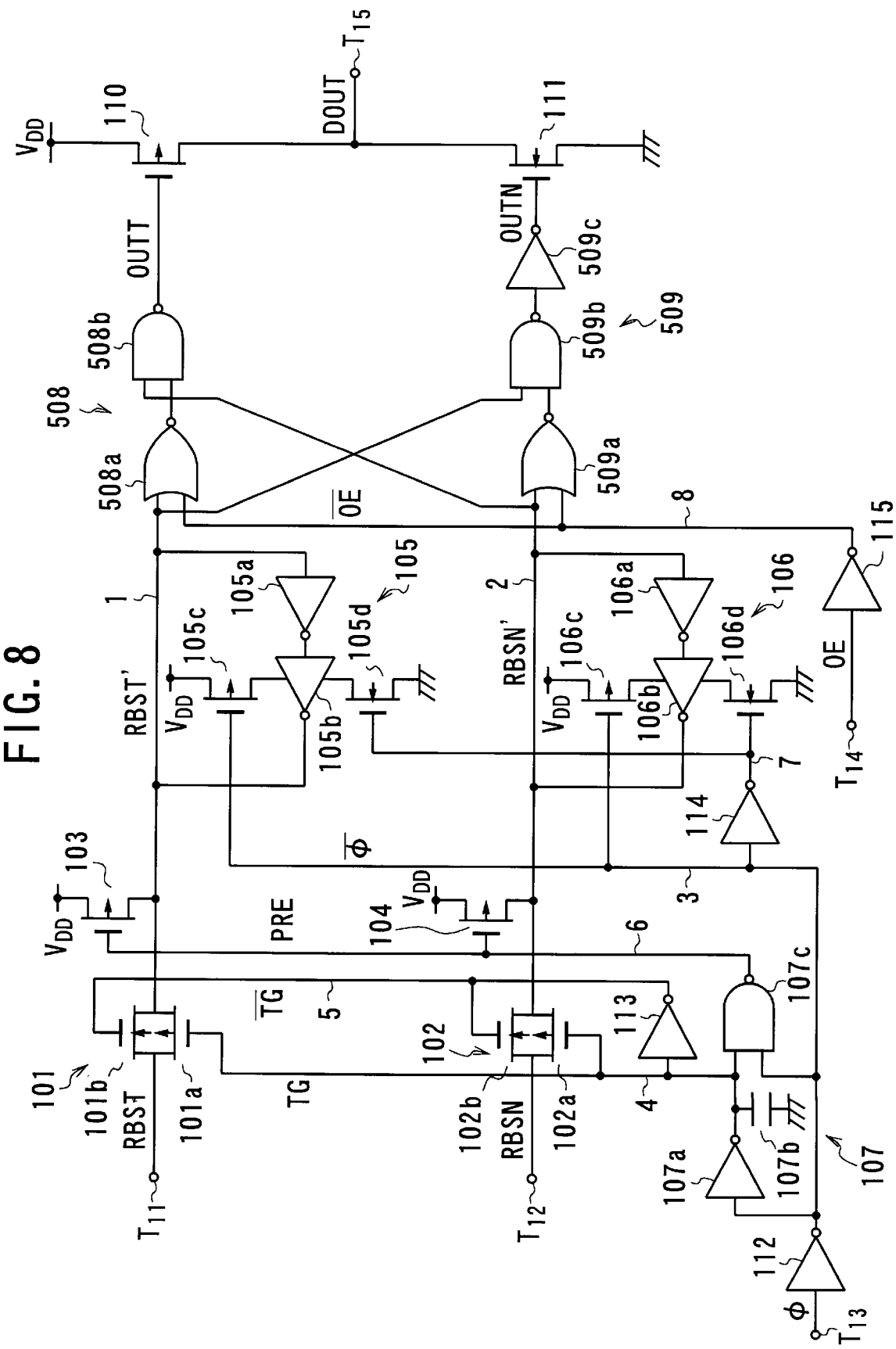
FIG. 8 is a block diagram showing the circuit configuration of an output circuit of a semiconductor memory device with the EDO function according to a third embodiment of the present invention.

FIG. 8 shows an output circuit of a DRAM with the EDO function according to a third embodiment of the present invention, which has the same configuration and operation as those of the first embodiment except that the first and second output drivers 108 and 109 are replaced with first and second output drivers 508 and 509, respectively.

Therefore, the explanation about the same configuration and operation as those of the first embodiment is omitted here for the sake of simplification of description by attaching the same reference numerals or characters to the same circuit elements in FIG. 8.

An seen from FIG. 8, the first driver 508 of the driver section is formed by a NOR gate 508a and a NAND gate 508b. A first input of the NOR gate 508a is connected to the output of the first transfer gate 101 through the first node 1. A second input of the NOR gate 508a is connected to the output of the inverter 115 through the node 8. An output of the NOR gate 508a is connected to a second input of the NAND gate 508b. An output of the NAND gate 508b is connected to the gate of the p-channel MOSFET 110 of the output section.

The second driver 509 of the driver section is formed by a NOR gate 509a, a NAND gate 509b, and an inverter 509c. A first input of the NOR gate 509a is connected to the output of the second transfer gate 102 through the second node 2. A second input of the NOR gate 509a is connected to the output of the inverter 115 through the node 8. An output of the NOR gate 509a is connected to a second input of the NAND gate 509b. An output of the NOR gate 509a is connected to a second input of the NAND gate 509b. An output of the NAND gate 509b is connected to an input of the inverter 509c. An output of the inverter 509c is connected to the gate of the n-channel MOSFET 111 of the output section.

A first input of the NOR gate 508a of the first driver 508 is connected to a first input of the NAND gate 509b of the second driver 509. A first input of the NOR gate 509a of the second driver 509 is connected to a first input of the NAND gate 508b of the first driver 508.

Thus, the first inputs of the NOR and NAND gates 508a and 508b are crossly coupled with the first inputs of the NOR and NAND gates 509a and 509b.

In response to the latched first read-bus data signal RBST' and the inverted output-enable signal $\overline{OE}$, the first driver 508 outputs the first driving signal OUTT to the gate of the p-channel MOSFET 110. In response to the latched second read-bus data signal RBSN' and the inverted output-enable signal $\overline{OE}$, the second driver 509 outputs the second driving signal OUTN to the gate of the n-channel MOSFET 111.

In the output circuit according to the third embodiment, the first inputs of the NOR and NAND gates 508a and 508b are crossly coupled with the first inputs of the NOR and NAND gates 509a and 509b. Therefore, when the second read-bus data signal RBSN' latched at the second node 2 is in the logic state L, the first driving signal OUTT is always in the logic state H independent of the logic state of the first read-bus data signal RBST' latched at the first node 1, thereby making it sure to turn the p-channel MOSFET 110 OFF.

Also, when the first latched read-bus data signal RBST' is in the logic state L, the second driving signal OUTN is always in the logic state L independent of the logic state of the second read out data signal RBSN', thereby turning the n-channel MOSFET 111 OFF.

Similarly, when the first and second latched read-bus data signals RBST' and RBSN' are in the logic state H, the first driving signal OUTT is in the logic state H and the second driving signal OUTN is in the logic state L, thereby turning the p- and n-channel MOSFETs 111 and 110 OFF.

As a result, the output circuit according to the third embodiment has an additional advantage as follows.

There is a possibility that the complementary first and second read-bus data signals RBST' and RBSN' latched at the first and second nodes 1 and 2 may approach simultaneously the logic state L or H due to instability of the level of the first and second read-bus data signals RBST and RBSN. However, the ON-ON state of the p- and n-channel MOSFETs 110 and 111 is surely prevented from occurring even in this case in the third embodiment.

On the other hand, there is a disadvantage that the obtainable access speed becomes lower than the first and second embodiments due to the existence of the NAND gates 508b and 509b in the first and second driving circuits 508 and 509.

Next, the operation of the output circuit according to the third embodiment shown in FIG. 8 is explained below with reference to FIGS. 9A to 9C, which show the waveforms of the first and second driving signals OUTT and OUTN and the output data signal DOUT.

In the third embodiment, the external clock signal CAS, the column address signal ADD, the transfer control signal φ, the first and second read-bus data signals RBST and RBSN, the precharge signal PRE, the transfer-gate control signal TG, the latched first and second read-bus data signals RBST' and RBSN', and the output-enable signal OE have the same timing diagrams as shown in FIGS. 5A to 5J, respectively. Therefore, only the first and second driving signals OUTT and OUTN and the output data signal DOUT are shown in FIGS. 9A to 9C, respectively.

In the same way as the first embodiment, the precharge signal PRE is turned from the logic state H to the logic state L (i.e., activated) at the time T9, and the second latched read-bus data signal RBSN' is turned from the logic state L to the logic state H at the time T10, as shown in FIG. 5I. This is caused by the precharge behavior by the precharge MOSFETs 103 and 104. Since the first latched read-bus data signal RBST' has been in the logic state H, this data signal RBST' is kept unchanged at the time T10, as shown in FIG. 5H.

Figure 9A:
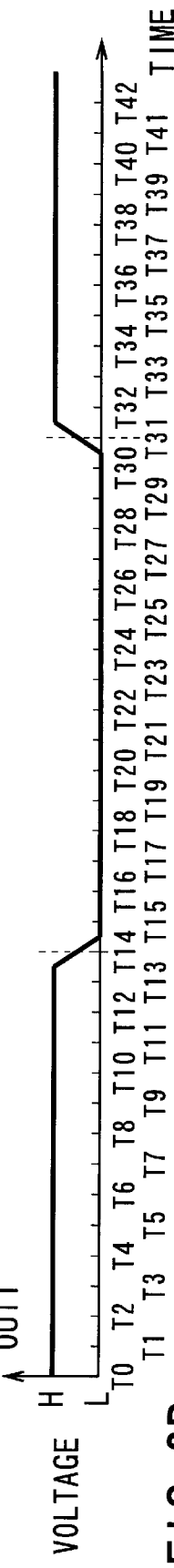
FIGS. 9A to 9C are timing diagrams showing an operation of the output circuit according to the third embodiment of FIG. 8, respectively.
Figure 9B:
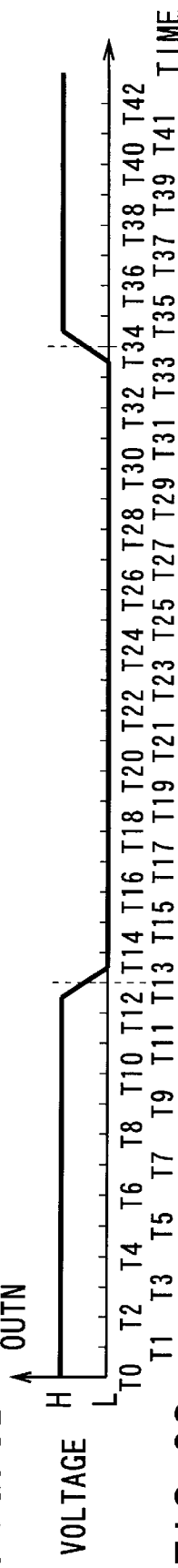

Due to the turning of the second latched read-bus data signal RBSN', the second driving signal OUTN is turned to the logic state L at the time T13, as shown in FIG. 9B. Thus, the n-channel output MOSFET 111 is turned OFF. At this time, the first driving signal OUTT is in the logic state H, as shown in FIG. 5K. Therefore, the p-channel output MOSFET 111 is kept in the OFF state.

In the same way as the first embodiment, the first driving signal OUTT is turned from the logic state H to the logic state L at the time T14, as shown in FIG. 9A. Thus, the p-channel MOSFET 110 is turned to the ON state at the time T16 while the n-channel MOSFET 111 is kept in OFF state. As a result, the output signal DOUT is turned from the logic state L to the logic state H at the time T16, as shown in FIG. 9C.

Further, in the same way as the first embodiment, the precharge signal PRE is turned from the logic state H to the logic state L (i.e., activated) at the time T28, as shown in FIG. 5F, and the first latched read-bus data signal RBST' is turned from the logic state L to the logic state H at the time T29, as shown in FIG. 5H. This is caused by the precharge behavior by the precharge MOSFETs 103 and 104. Since the second latched read-bus data signal RBSN' has been in the logic state H, this data signal RBSN' is kept unchanged at the time T29, as shown in FIG. 5I.

Due to the turning of the first latched read-bus data signal RBST', the first driving signal OUTT is turned to the logic state H at the time T31, as shown in FIG. 9A. Thus, the p-channel output MOSFET 110 is turned OFF. At this time, the second driving signal OUTN is in the logic state L, as shown in FIG. 9B. Therefore, the n-channel output MOSFET 111 is kept in the OFF state.

Due to the turning of the transfer-gate control signal TG to the logic state L at the time T30, the first and second transfer gates 101 and 102 are opened to thereby transfer the first and second read-bus data signals RBST and RBSN to the first and second nodes 1 and 2, respectively, as shown in FIGS. 5H and 5I. Thus, the second read-bus data signal RBSN' latched at the second node 2 is turned from the logic state H to the logic state L at the time T31. At this time, the first read-bus data signal RBST' latched at the first node 1 is in the logic state H.

Due to the turning of the second latched read-bus data signal RBSN', the second driving signal OUTN is turned from the logic state H to the logic state L at the time T34. Thus, the n-channel MOSFET 111 is turned to the ON state at the time T34 while the p-channel MOSFET 110 is kept in OFF state.

Figure 9C:
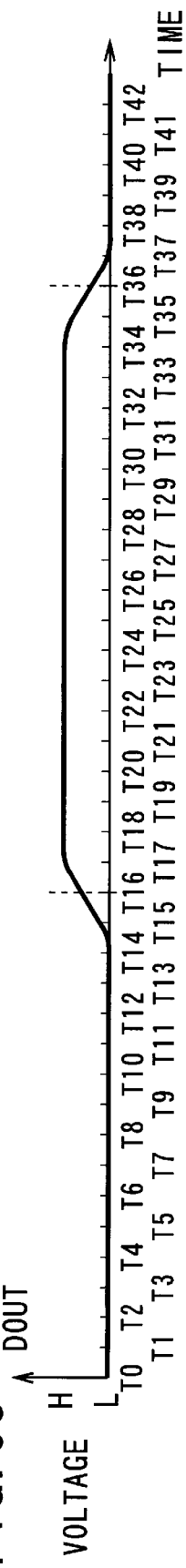

As a result, the output signal DOUT is turned from the logic state H to the logic state L at the time T34, as shown in FIG. 9C.

The subsequent steps after the time T34 are the same as those in the first embodiment.

In the third embodiment, the first and second precharge MOSFETs M103 and M104 precharge the first and second nodes 1 and 2 to the power supply voltage $V_{DD}$. However, it is needless to say that the first and second precharge MOSFETs M103 and M104 may precharge the first and second nodes 1 and 2 to the ground potential (GND), as explained in the output circuit according to the second embodiment of FIG. 6.

Although the present invention is applied to DRAMs in the first to third embodiments, it is needless to say that the invention may be applied to any other semiconductor memory devices with the EDO function.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. An output circuit of a semiconductor memory device, comprising:

first and second transfer gates for receiving first and second complementary read-bus data signals and for transferring said first and second read-bus data signals according to a transfer-gate control signal;

first and second latches for latching said first and second complementary read-bus data signals transferred by said first and second transfer gates at first and second nodes, respectively;

a precharge signal generator for generating a precharge signal to precharge said first and second nodes to a same electric potential;

first and second transistor drivers for outputting first and second driving signals according to said first and second complementary read-bus data signals latched by said first and second latches at said first and second nodes, respectively; and first and second complementary output transistors driven by said first and second driving signals outputted from said first and second transistor drivers, respectively;

wherein said first and second nodes are respectively precharged to the same electric potential by said precharge signal before said first and second complementary read-bus data signals are transferred by said first and second transfer gates and latched by said first and second latches at said first and second nodes, respectively;

whereby said first and second driving signals from said first and second transistor drivers are outputted to said first and second complementary output transistors at different timings, respectively, thereby preventing an ON-ON state of said first and second complementary output transistors.

2. The circuit as claimed in claim 1, wherein said precharge signal is generated by using said transfer-gate control signal.

3. The circuit as claimed in claim 1, further comprising first and second precharge transistors controlled by said precharge signal;

said first and second precharge transistors serve to precharge said first and second nodes to the same electric potential, respectively.

4. The circuit as claimed in claim 1, wherein the same electric potential to which said first and second nodes are precharged is equal to a power supply voltage or a ground.

5. The circuit as claimed in claim 1, wherein said first and second output drivers includes first and second logic elements that prevent an ON-ON state of said first and second output transistors from occurring even if both of said first and second read-bus data signals latched at said first and second nodes are in a high logic state or a low logic state.

* * * * *